(12) United States Patent
Lee et al.

(10) Patent No.: US 11,658,092 B2
(45) Date of Patent: May 23, 2023

(54) THERMAL INTERCONNECT STRUCTURE FOR THERMAL MANAGEMENT OF ELECTRICAL INTERCONNECT STRUCTURE

(71) Applicant: Taiwan Semiconductor Manufacturing Co., Ltd., Hsinchu (TW)

(72) Inventors: Shao-Kuan Lee, Kaohsiung (TW);
Cherng-Shiaw Tsai, New Taipei (TW);
Ting-Ya Lo, Hsinchu (TW);
Cheng-Chin Lee, Taipei (TW);
Chi-Lin Teng, Taichung (TW);
Kai-Fang Cheng, Taoyuan (TW);
Hsin-Yen Huang, New Taipei (TW);
Hsiao-Kang Chang, Hsinchu (TW);
Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 181 days.

(21) Appl. No.: 17/097,441

(22) Filed: Nov. 13, 2020

(65) Prior Publication Data
US 2022/0157690 A1 May 19, 2022

(51) Int. Cl.
| | |
|---|---|
| *H01L 23/373* | (2006.01) |
| *H01L 21/768* | (2006.01) |
| *H01L 23/48* | (2006.01) |
| *H01L 23/522* | (2006.01) |

(Continued)

(52) U.S. Cl.
CPC ........ *H01L 23/373* (2013.01); *H01L 21/7682* (2013.01); *H01L 21/76877* (2013.01); *H01L 23/481* (2013.01); *H01L 23/53295* (2013.01)

(58) Field of Classification Search
CPC ........... H01L 21/7682; H01L 21/76877; H01L 23/373; H01L 23/481; H01L 23/367; H01L 23/3677
See application file for complete search history.

(56) References Cited

U.S. PATENT DOCUMENTS

2006/0284157 A1* 12/2006 Chen .................. H01L 45/1233
257/2
2009/0283901 A1* 11/2009 Ohmi ................ H01L 21/76831
257/E23.141

(Continued)

*Primary Examiner* — Herve-Louis Y Assouman
(74) *Attorney, Agent, or Firm* — Eschweiler & Potashnik, LLC

(57) ABSTRACT

In some embodiments, the present disclosure relates to an integrated chip that includes an electrical interconnect structure, a thermal interconnect structure, and a thermal passivation layer over a substrate. The electrical interconnect structure includes interconnect vias and interconnect wires embedded within interconnect dielectric layers. The thermal interconnect structure is arranged beside the electrical interconnect structure and includes thermal vias, thermal wires, and/or thermal layers. Further, the thermal interconnect structure is embedded within the interconnect dielectric layers. The thermal passivation layer is arranged over a topmost one of the interconnect dielectric layers. The thermal interconnect structure has a higher thermal conductivity than the interconnect dielectric layers.

20 Claims, 19 Drawing Sheets

(51) Int. Cl.
*H01L 23/532* (2006.01)
*H01L 23/367* (2006.01)

(56) References Cited

U.S. PATENT DOCUMENTS

| 2014/0246757 | A1* | 9/2014 | Daley | G06F 30/394 |
| | | | | 257/621 |
| 2018/0130697 | A1* | 5/2018 | Jang | H01L 21/76843 |
| 2018/0151463 | A1* | 5/2018 | Venugopal | H01L 23/373 |
| 2018/0151470 | A1* | 5/2018 | Cook | H01L 24/05 |

* cited by examiner

THERMAL INTERCONNECT STRUCTURE FOR THERMAL MANAGEMENT OF ELECTRICAL INTERCONNECT STRUCTURE

BACKGROUND

The semiconductor industry continues to improve the integration density of various electronic components (e.g., transistors, diodes, resistors, capacitors, etc.) by, for example, reducing minimum feature sizes, which allows more components to be integrated into a given area. Smaller package structures, that utilize less area or smaller heights, are developed to package the semiconductor devices. Techniques to reduce capacitance, heat build-up, and other side effects resulting from closely arranged electronic components in an integrated chip are often investigated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
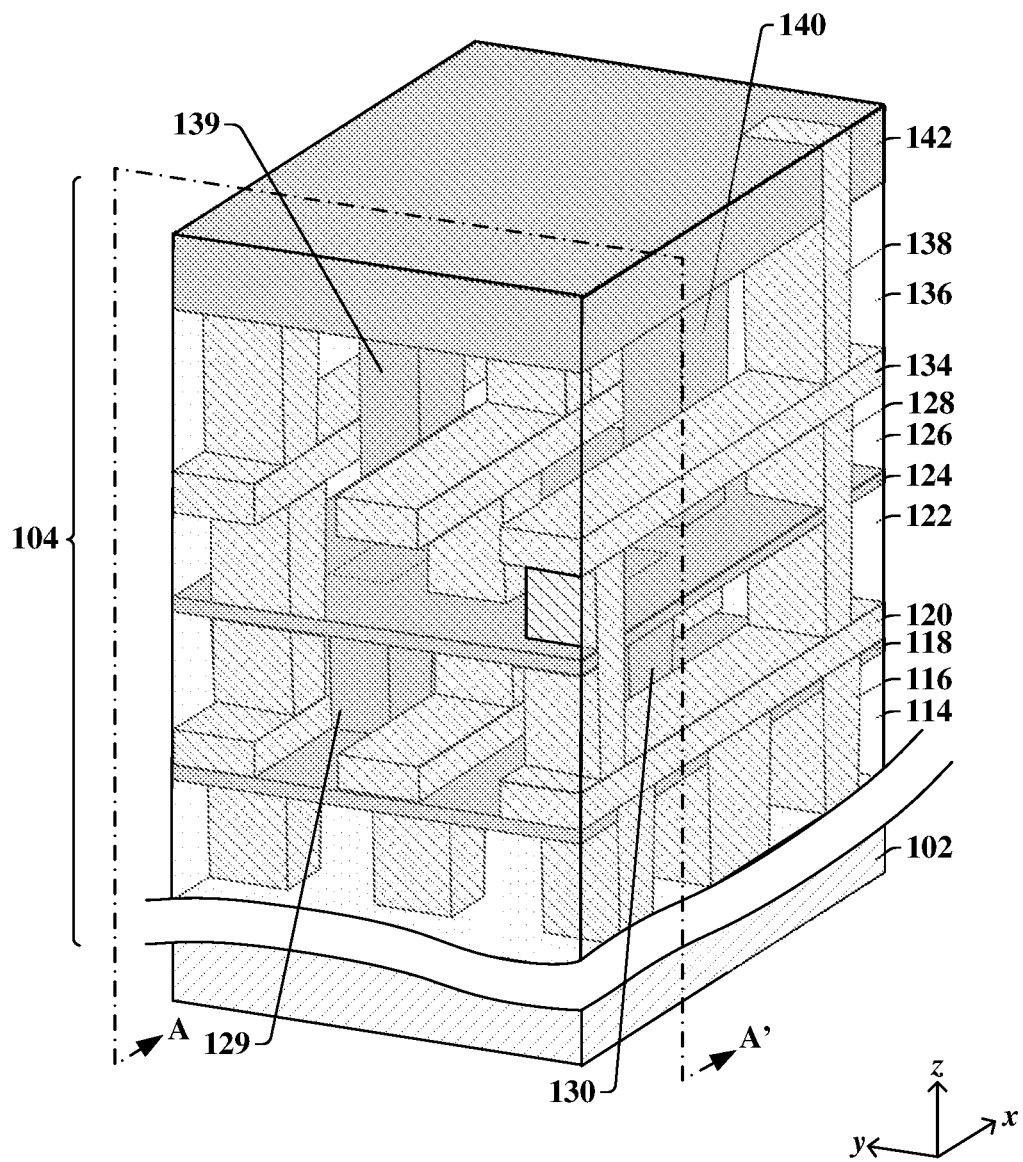
FIG. 1A illustrates a perspective view of some embodiments of an integrated chip having a thermal interconnect structure distributed throughout an electrical interconnect structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, capacitors, inductors, etc.) and/or memory devices disposed over and/or within a semiconductor substrate. An interconnect structure may be disposed over the semiconductor substrate and coupled to the semiconductor devices. The interconnect structure may include many interconnect wires and interconnect vias within interconnect dielectric layers. The interconnect wires and vias provide electrical pathways between different electronic devices disposed within and/or over the semiconductor substrate.

In some embodiments, as signals (e.g., current, voltage) travel through the interconnect structure and between various semiconductor and/or memory devices, the signals (e.g., current, voltage) may generate heat. The heat may build-up in the interconnect dielectric layers and become trapped in the interconnect structure. For example, in some embodiments, the interconnect dielectric layers comprise materials with low thermal conductivity, which increases the trapping of generated heat in the interconnect dielectric layers. Further, in some embodiments, as the size of the interconnect structure decreases to increase device density over the semiconductor substrate, the interconnect vias and interconnect wires of the interconnect structure are arranged closer to one another. The closer the interconnect vias and interconnect wires are arranged, the quicker generated heat may build-up and become trapped in the interconnect structure. In some instances, the trapped heat may damage and degrade performance of the semiconductor and/or memory devices and/or may damage the interconnect structure by causing mechanical peeling between layers/materials, for example.

Various embodiments of the present disclosure relate to forming a thermal interconnect structure within an electrical interconnect structure, wherein the thermal interconnect structure provides non-conductive pathways for the dissipation of heat, and wherein the electrical interconnect structure is a typical interconnect structure in an integrated chip used to transport signals (e.g., current, voltage) throughout an integrated chip. In some such embodiments, the electrical interconnect structure comprises interconnect wires and interconnect vias embedded in an interconnect dielectric structure comprising one or more interconnect dielectric layers. Further, the thermal interconnect structure comprises thermal vias, thermal wires, and/or thermal layers arranged within the interconnect dielectric structure and between the interconnect wires and interconnect vias. The thermal interconnect structure provides various thermal dissipation pathways for heat to escape from the electrical interconnect structure. In some embodiments, the thermal interconnect structure comprises non-conductive, dielectric materials that have a higher thermal conductivity than the interconnect dielectric structure. Thus, generated heat from the electrical interconnect structure and/or electronic devices (e.g., semiconductor devices, memory devices, photo devices, etc.) coupled to the electrical interconnect structure may dissipate out of the electrical interconnect structure through the thermal interconnect structure.

Because the thermal interconnect structure comprises non-conductive materials, the thermal interconnect structure does not interfere with the signals (e.g., current, voltage) traveling through the electrical interconnect structure. Further, the thermal interconnect structure may be easily incorporated into the manufacturing process of an electrical interconnect structure by way of performing additional damascene-like processes to efficiently provide thermal dissipation pathways in an integrated chip, thereby increasing the reliability of the integrated chip.

FIG. 1A illustrates a perspective view 100A of some embodiments of an integrated chip comprising an electrical interconnect structure arranged over a substrate and a thermal interconnect structure arranged within the electrical interconnect structure.

The perspective view 100A of FIG. 1A includes an electrical interconnect structure 104 arranged over a substrate 102. The electrical interconnect structure 104 comprises a first interconnect via 116; a first interconnect wire 120 arranged over and coupled to the first interconnect via 116; a second interconnect via 128 arranged over and coupled to the first interconnect wire 120; a second interconnect wire 134 arranged over and coupled to the second interconnect via 128; and a third interconnect via 138 arranged over and coupled to the second interconnect wire 120. In some embodiments, the electrical interconnect structure 104 further includes interconnect dielectric layers. For example, in some embodiments, the first interconnect via 116 is arranged in and extends through a first interconnect dielectric layer 114; the second interconnect via 128 arranged in and extends through and is embedded in a second interconnect dielectric layer 122 and a third interconnect dielectric layer 126; and the third interconnect via 138 is arranged in and extends through a fourth interconnect dielectric layer 136.

In some embodiments, the electrical interconnect structure 104 is a three-dimensional structure, wherein the interconnect vias (116, 128, 138) and the interconnect wires (120, 134) are arranged in an x-direction, a y-direction, and a z-direction. The interconnect vias (116, 128, 138) and the interconnect wires (120, 134) provide a network of various electrical pathways for signals (e.g., current, voltage) to travel between various electronic devices (e.g., semiconductor devices, memory devices, photo devices, etc.) arranged on or within the substrate 102. In some embodiments, the interconnect dielectric layers (114, 122, 126, 136) comprise a dielectric material to reduce capacitance and thus, cross-talk between the various interconnect vias (116, 128, 138) and the interconnect wires (120, 134) of the electrical interconnect structure 104. For example, in some embodiments, the interconnect dielectric layers (114, 122, 126, 136) may comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. It will be appreciated that the interconnect dielectric layers (114, 122, 126, 136) of FIG. 1A are illustrated as somewhat transparent in order to see the interconnect vias (116, 128, 138) and the interconnect wires (120, 134). In some embodiments, the interconnect dielectric layers (114, 122, 126, 136) may or may not be transparent.

In some embodiments, the integrated chip of FIG. 1A further includes a thermal interconnect structure comprising thermal vias and thermal layers. For example, in some embodiments, a first thermal via 130 is arranged within the second interconnect dielectric layer 122 and beside the first interconnect wire 120 in the y-direction. In some embodiments, a second thermal via 140 is arranged within the third and fourth interconnect dielectric layers 126, 136 and beside the second interconnect wire 134 in the y-direction. In some embodiments, the thermal interconnect structure further comprises a third thermal via 129 arranged within the second interconnect dielectric layer 122 and beside the first thermal via 130 in the y-direction. In some embodiments, a fourth thermal via 139 is arranged within the third and fourth interconnect dielectric layers 126, 136 and beside the second thermal via 140 in the y-direction.

In some embodiments, the thermal interconnect structure further comprises thermal layers. For example, in some embodiments, a first thermal layer 118 is arranged below the first interconnect wire 120, and a second thermal layer 124 is arranged between the first and second interconnect wires 120, 134. In some embodiments, the first interconnect via 116 extends completely through the first thermal layer 118, and the second interconnect via 128 extends completely through the second thermal layer 124. In some embodiments, the first and third thermal vias 130, 129 extend between the first and second thermal layers 118, 124, and the second and fourth thermal vias 140, 139 extend between the second thermal layer 124 and a thermal passivation layer 142. In some embodiments, the thermal passivation layer 142 is arranged over a topmost interconnect dielectric layer, which in FIG. 1A, is the fourth interconnect dielectric layer 136. In some embodiments, a topmost interconnect via, which in FIG. 1A is the third interconnect via 138, extends through the thermal passivation layer 142.

In some embodiments, the thermal vias (130, 140, 129, 139), the thermal layers (118, 124), and the thermal passivation layer 142 comprise materials that have higher conductivities than the interconnect dielectric layers (114, 122, 126, 136). Thus, in some embodiments, while signals (e.g., current, voltage) travel through the interconnect vias (116, 128, 138) and the interconnect wires (120, 134) of the electrical interconnect structure 104, heat may be generated and travel to features of the integrated chip having a high thermal conductivity, such that the heat may escape from the integrated chip. In some such embodiments, the thermal interconnect structure provides thermal dissipation pathways for any generated heat to travel away from the substrate 102 and towards the thermal passivation layer 142 to escape from the integrated chip. Thus, in some embodiments, the thermal interconnect structure may be a continuously connected structure throughout the electrical interconnect structure 104 such that heat may escape from the integrated chip through the thermal passivation layer 142.

In some embodiments, the thermal vias (130, 140, 129, 139), the thermal layers (118, 124), and the thermal passivation layer 142 also comprise materials that are not conductive such that the thermal interconnect structure does not interfere with signals (e.g., current, voltage) traveling through the electrical interconnect structure 104. In some embodiments, the thermal vias (130, 140, 129, 139), the thermal layers (118, 124), and the thermal passivation layer 142 may each comprise, for example, aluminum nitride, aluminum oxide, silicon nitride, silicon carbide, magnesium oxide, beryllium oxide, boron nitride, diamond, or some other suitable insulator (i.e., not conductive) material that is different than the material(s) of the interconnect dielectric layers (114, 122, 126, 136) and that has a higher thermal conductivity than the material(s) of the interconnect dielectric layers (114, 122, 126, 136). In some embodiments, the thermal vias (130, 140, 129, 139), the thermal layers (118, 124), and the thermal passivation layer 142 comprise the same material, whereas in some other embodiments, the thermal vias (130, 140, 129, 139), the thermal layers (118, 124), and/or the thermal passivation layer 142 comprise different materials. Nevertheless, the thermal interconnect structure and the thermal passivation layer 142 provide an efficient thermal dissipation pathway for heat to escape from an integrated chip to mitigate damage to and thus, increase the reliability of the integrated chip.

Figure 1B:
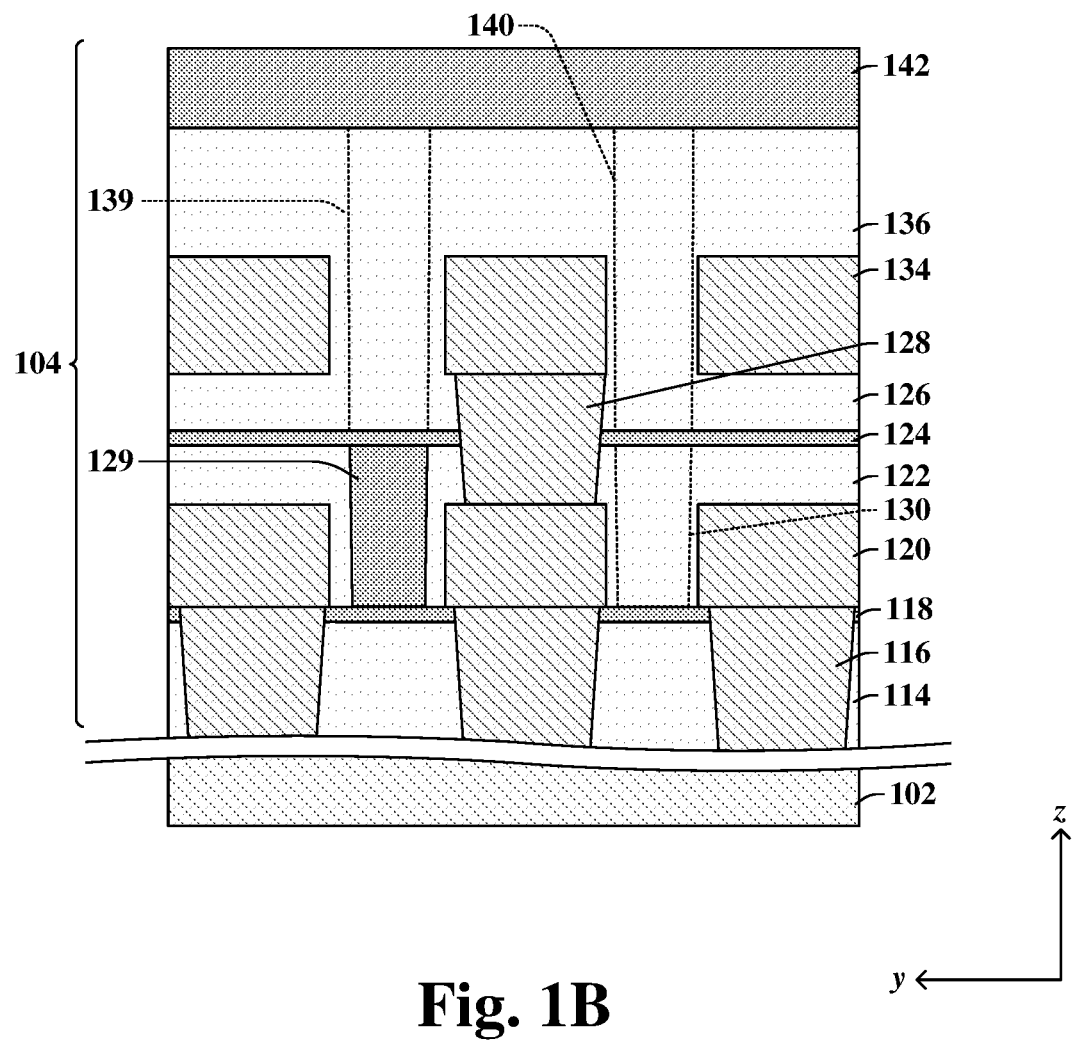
FIG. 1B illustrates a cross-sectional view of some embodiments of an integrated chip having a thermal interconnect structure arranged between conductive features of an electrical interconnect structure.

FIG. 1B illustrates a cross-sectional view 100B of some embodiments corresponding to cross-section line AA' of FIG. 1A. Thus, in some embodiments, the cross-sectional view 100B of FIG. 1B illustrates a thermal interconnect structure arranged within an electrical interconnect structure on a yz-plane.

In some embodiments, the third thermal via 129 is arranged directly between adjacent ones of the first interconnect wires 120. In some embodiments, the third thermal via 129 does not directly contact the first interconnect wires 120 to avoid damage to the first interconnect wires 120 during processing. In some other embodiments, the third thermal via 129 may directly contact the first interconnect wires 120. In some embodiments, the first thermal layer 118 directly contacts the first interconnect wires 120 and the first interconnect vias 116. In some embodiments, the second thermal layer 124 directly contacts the second interconnect via 128, wherein the second interconnect via 128 extends completely through the second thermal layer 124. In some embodiments, the first, second, and fourth thermal vias 130, 140, 139 are arranged behind the interconnect dielectric layers (122, 126, 136), and thus, are illustrated with dotted lines in FIG. 1B.

It will be appreciated that other configurations of the electrical interconnect structure 104 and the thermal interconnect structure are within the scope of the disclosure. For example, in some embodiments, a bottommost feature of the thermal interconnect structure is the first thermal layer 118, whereas in other embodiments (not shown), a bottommost feature of the thermal interconnect structure may extend below the first thermal layer 118 and may even contact the substrate 102. In some embodiments, the thermal interconnect structure may comprise more or less thermal vias (130, 140, 129, 139) and/or thermal layers (118, 124) than what is illustrated in the cross-sectional view 100B of FIG. 1B, Further, in some embodiments, the thermal interconnect structure may also comprise, for example, thermal wires (e.g., see, 606 of FIG. 6). Nevertheless, the thermal interconnect structure may be arranged within the interconnect dielectric layers (114, 122, 126, 136) and around the interconnect vias (116, 128) and the interconnect wires (120, 134) to provide various thermal dissipation pathways for heat to efficiently escape out of the electrical interconnect structure 104 and the integrated chip without interfering with signals (e.g., current, voltage) traveling through the electrical interconnect structure 104.

Figure 2:
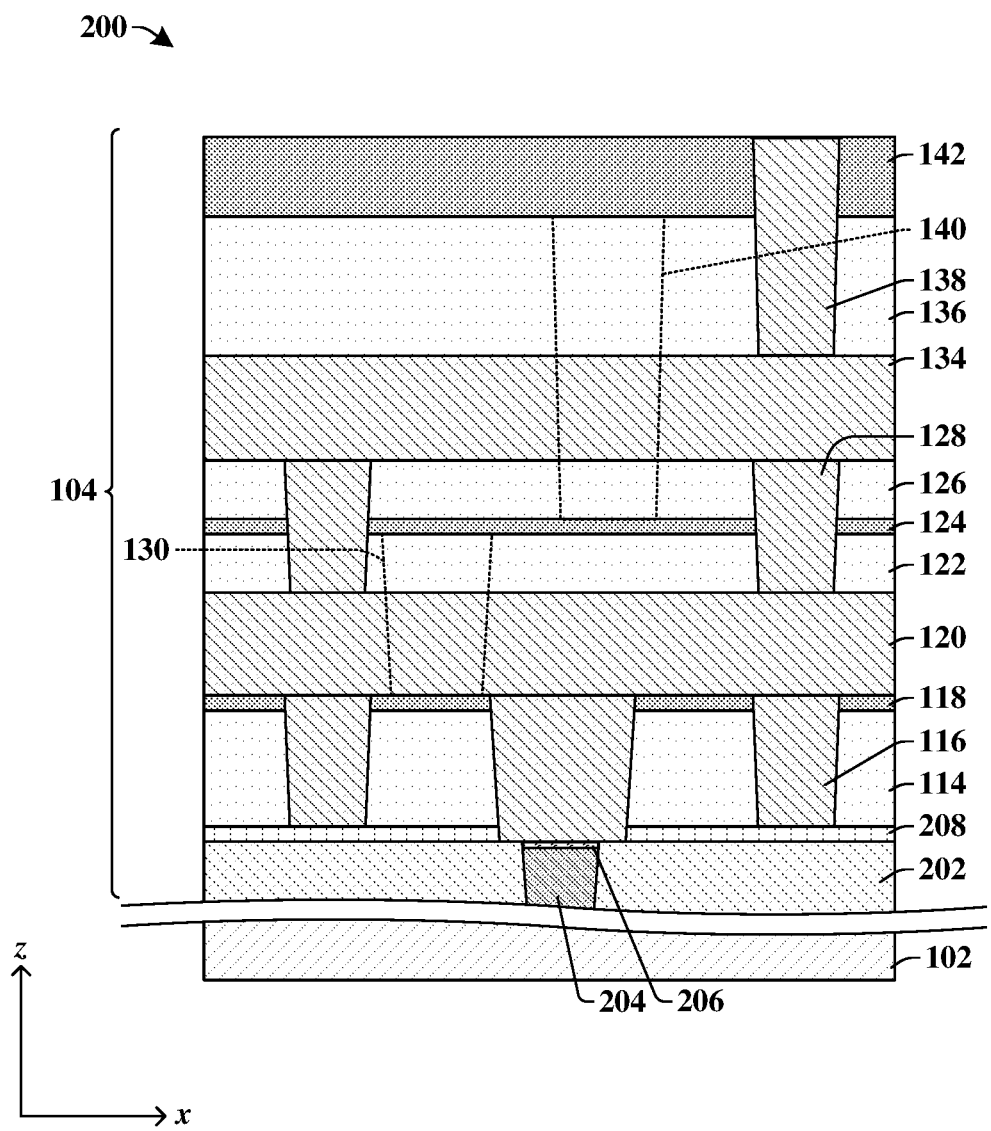
FIG. 2 illustrates a cross-sectional view of some embodiments of an integrated chip having a thermal interconnect structure arranged behind conductive features of an electrical interconnect structure.

FIG. 2 illustrates a cross-sectional view 200 of some embodiments of the thermal interconnect structure arranged within the electrical interconnect structure. In some embodiments, the cross-sectional view 200 of FIG. 2 corresponds to a side-view of the perspective view 100A of FIG. 1A on an xz-plane.

In some embodiments, the thermal vias (130, 140) of the thermal interconnect structure are not visible. For example, in the cross-sectional view 200 of FIG. 2, in some embodiments, the first thermal via 130 and the second thermal via 140 are arranged behind the interconnect dielectric layers (114, 122, 126, 136), the interconnect vias (116, 128, 138), and the interconnect wires (120, 134). Thus, in the cross-sectional view 200 of FIG. 2, the first thermal via 130 and the second thermal via 140 are illustrated with dotted lines. Further, the second and third thermal vias (129, 139) are omitted from the cross-sectional view 200 of FIG. 2 for ease of illustration.

In some embodiments, the first interconnect via 116 is arranged over a glue layer 208. In some embodiments, the first interconnect via 116 extends through the glue layer 208 to contact a lower interconnect via 204. In some embodiments, the lower interconnect via 204 is embedded in a lower interconnect dielectric layer 202. In some embodiments, the glue layer 208 protects the lower interconnect dielectric layer 202 from damage during the formation of the first interconnect via 116 and/or aids in the adhesion of the first interconnect via 116 to the lower interconnect dielectric layer 202. In some embodiments, the glue layer 208 may comprise, for example, titanium nitride, tantalum nitride, silicon nitride, or some other suitable material. In some embodiments, glue layers may also be arranged between other interconnect dielectric layers (e.g., 114, 122, 126, 136) of the electrical interconnect structure 104. In some embodiments, the lower interconnect dielectric layer 202 comprises a same or different material as the first, second, third, and/or fourth interconnect dielectric layers 114, 122, 126, 136. In some embodiments, a capping layer 206 may be arranged over the lower interconnect via 204 and may comprise, for example, cobalt, copper, aluminum, or some other suitable metal. In some embodiments, the capping layer 206 may reduce the resistivity, electromigration, and/or some other property of the lower interconnect via 204 to increase the reliability of the lower interconnect via 204. In some embodiments, the interconnect vias (116, 128, 138, 204) and the interconnect wires (120, 134) comprise, for example, aluminum, tungsten, copper, cobalt, tantalum, titanium, or some other suitable conductive material.

Figure 3:
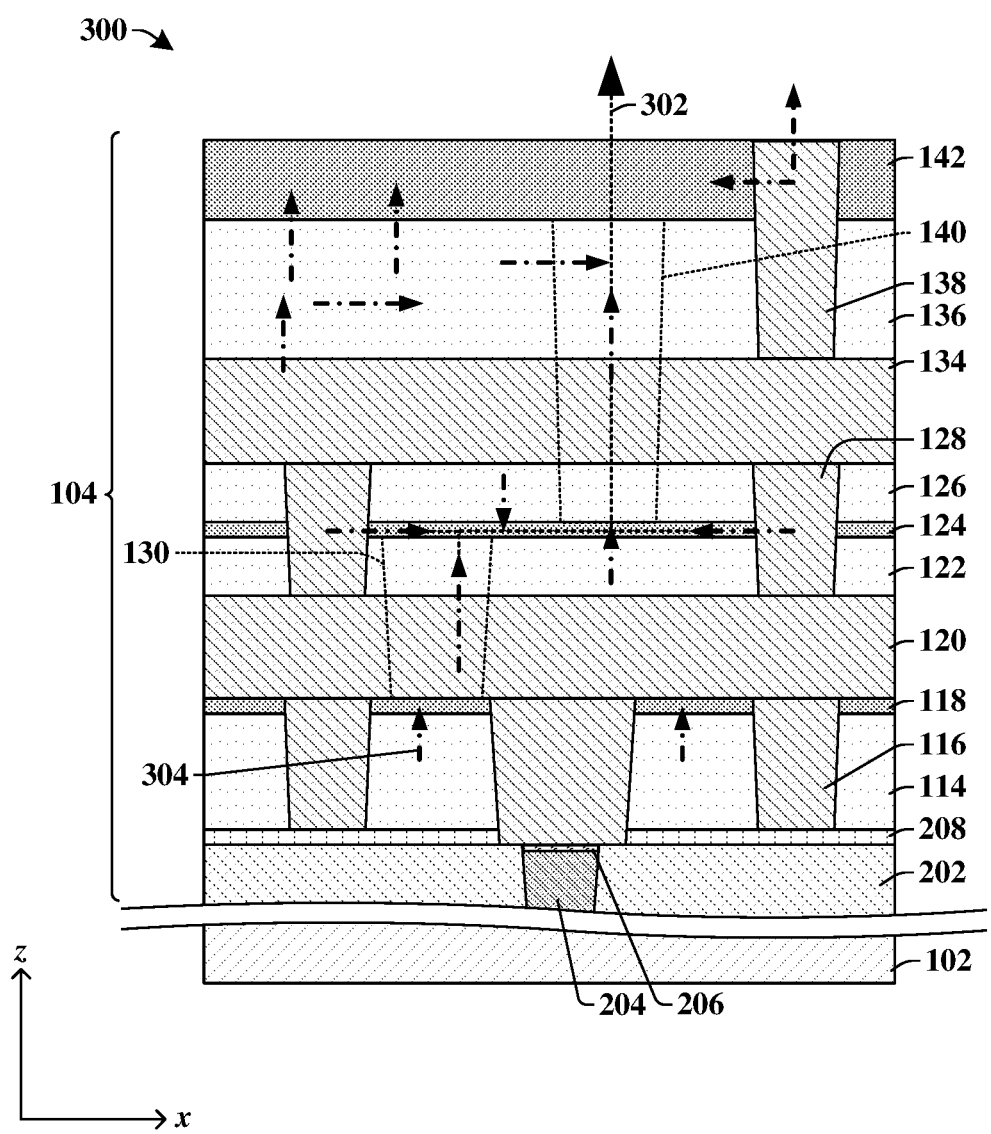
FIG. 3 illustrates a cross-sectional view of some embodiments of an integrated chip having a thermal interconnect structure arranged throughout an electrical interconnect structure and showing exemplary thermal dissipation pathways provided by the thermal interconnect structure.

FIG. 3 illustrates a cross-sectional view 300 of some embodiments of the electrical interconnect structure 104 and the thermal interconnect structure of FIG. 2 with exemplary thermal dissipation pathways traveling out of the electrical interconnect structure 104 through the thermal interconnect structure.

In some embodiments, as signals (e.g., current, voltage) travel through the interconnect vias (204, 116, 128, 138) and the interconnect wires (120, 134), heat is generated and dissipates at least partially into the interconnect dielectric layers (202, 114, 122, 126, 136). In some embodiments, heat enters, as indicated by arrow 304, the thermal interconnect structure from the interconnect dielectric layers (202, 114, 122, 126, 136) because the thermal interconnect structure comprises materials that have higher thermal conductivities than the interconnect dielectric layers (202, 114, 122, 126, 136). Once the heat enters, as indicated by arrow 304, the thermal interconnect structure, the heat may quickly travel through the thermal interconnect structure and out of the thermal passivation layer 142 through a thermal dissipation pathway 302. Thus, in some embodiments, the thermal vias (130, 140), the thermal layers (118, 124), and the thermal passivation layer 142 are continuously connected to allow heat to travel through the thermal dissipation pathway 302 as quickly as possible and escape from the thermal passivation layer 142 to reduce thermal damage to the integrated chip.

Figure 4:
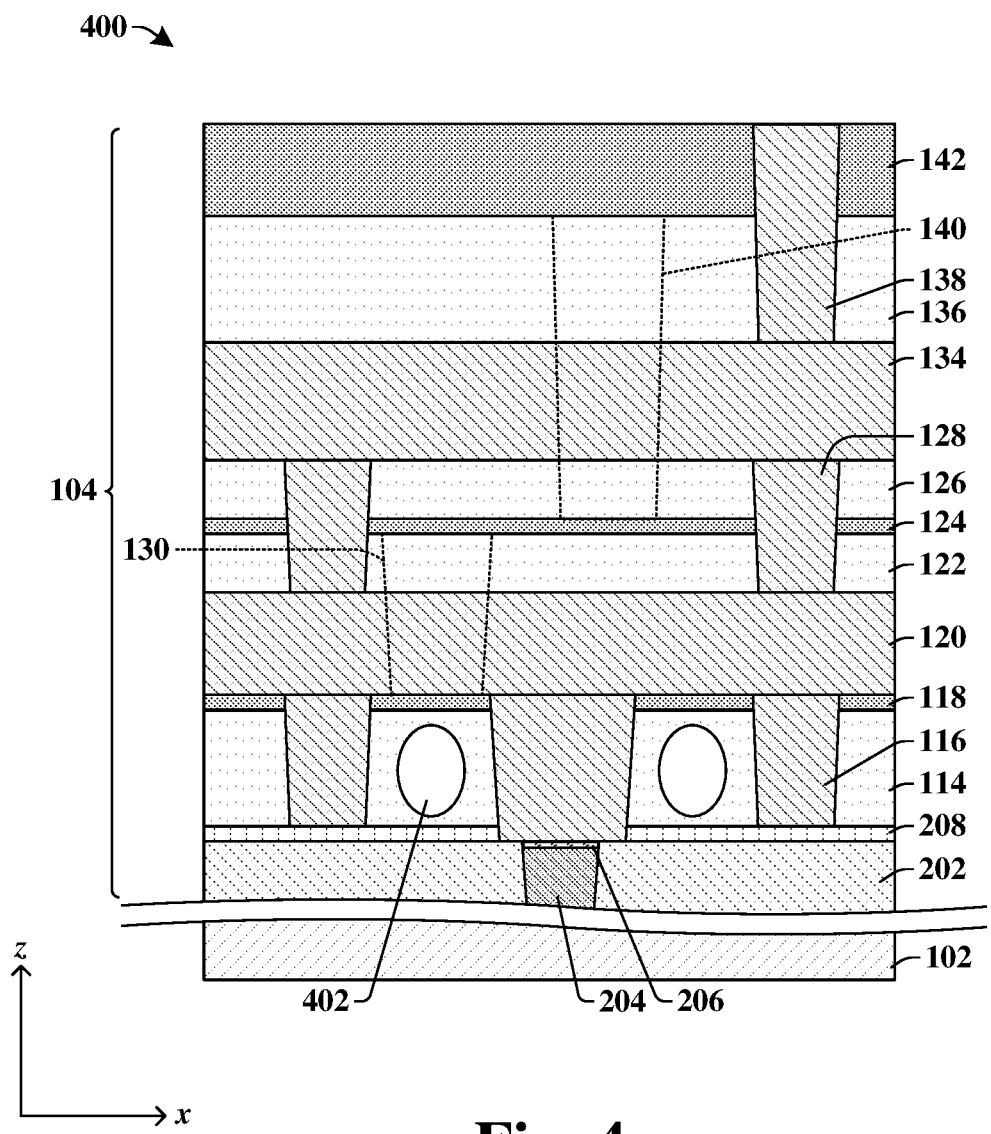
FIGS. 4-6 illustrate cross-sectional views of some embodiments of an integrated chip having a thermal interconnect structure arranged throughout an electrical interconnect structure and comprising air spacer structures between closely arranged interconnect vias.

FIG. 4 illustrates a cross-sectional view 400 of some other embodiments of an integrated chip comprising a thermal interconnect structure within an electrical interconnect structure 104 and comprising air spacer structures.

In some embodiments, air spacer structures 402 may be arranged within the first interconnect dielectric layer 114. In some embodiments, the air spacer structures 402 are cavities formed within the first interconnect dielectric layer 114 that is filled with air or some other suitable gas to provide a low dielectric insulator structure. In some embodiments, all surfaces of the air spacer structures 402 are defined by the first interconnect dielectric layer 114. In some embodiments, the air spacer structures 402 are arranged between nearest neighbors of the first interconnect vias 116. The air spacer structures 402 help reduce capacitance, and thus, cross-talk between closely arranged first interconnect vias 116. Thus, as the electrical interconnect structure 104 is reduced in size to increase device density over the substrate 102, the air spacer structures 402 may be used to maintain and/or increase the reliability of the electrical interconnect structure 104. In some embodiments, air spacer structures 402 may be arranged between other features of the electrical interconnect structure 104 than the first interconnect vias 116. For example, in some other embodiments (not shown), air spacer structures 402 may be arranged within the second and third interconnect dielectric layers 122, 126 and between the second interconnect vias 128. Nevertheless, in some embodiments, even with added features in the electrical interconnect structure 104, like the air spacer structures 402, the thermal interconnect structure may still be integrated within the electrical interconnect structure 104 to reduce thermal degradation to the integrated chip.

Figure 5:
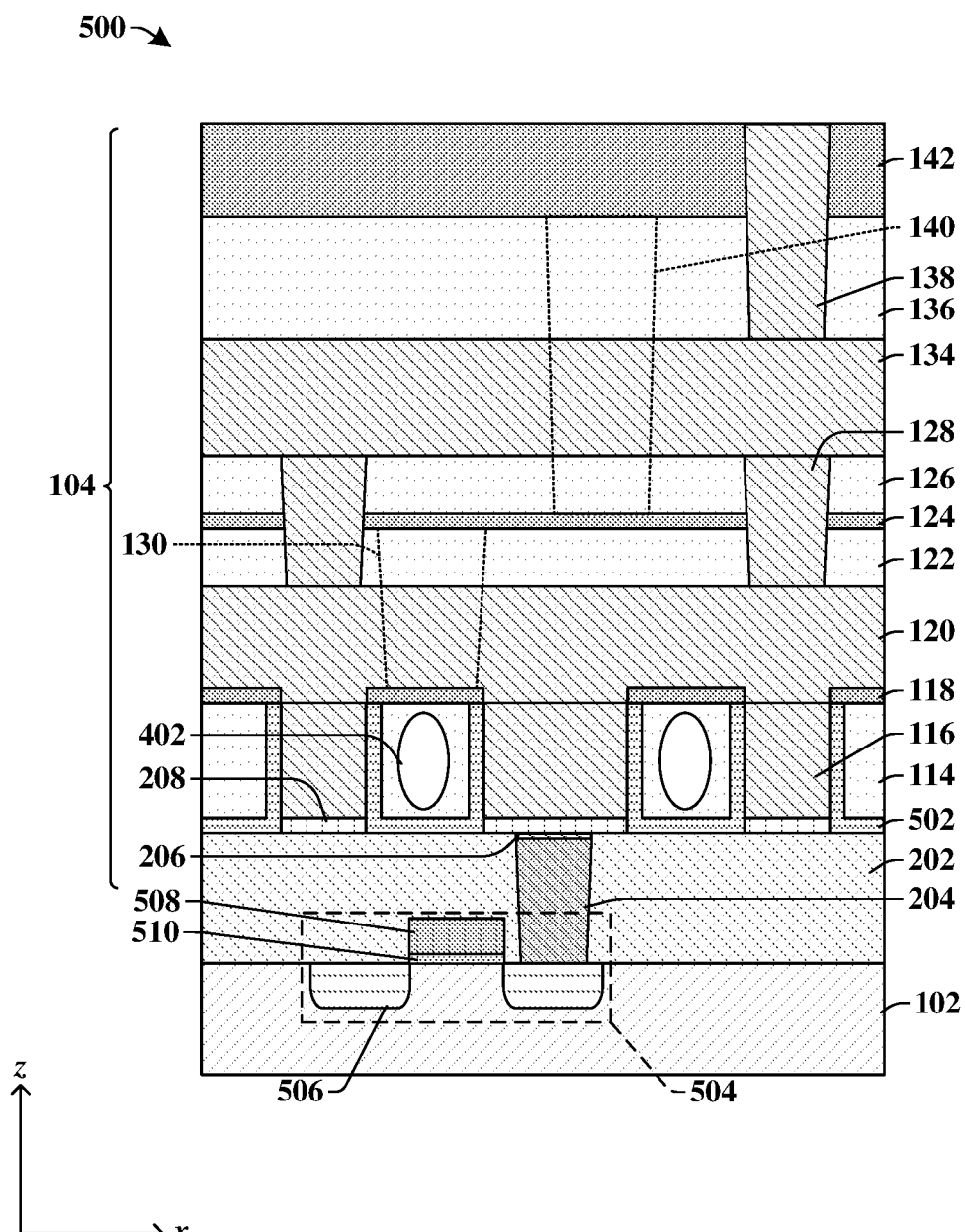

FIG. 5 illustrates a cross-sectional view 500 of some alternative embodiments of the cross-sectional view 400 of FIG. 4.

In some embodiments, the first interconnect via 116 has outermost sidewalls covered by a metal encapsulation layer 502. In some embodiments, the metal encapsulation layer 502 also covers outer sidewalls and bottom surfaces of the first interconnect dielectric layer 114. In some embodiments, the metal encapsulation layer 502 is used in processes wherein the first interconnect vias 116 are formed by way of metal etching before formation of the first interconnect dielectric layer 114, instead of a dual damascene process. Thus, in some embodiments, a metal encapsulation layer 502 may help protect the first interconnect via 116 while the first interconnect dielectric layer 114 and the air spacer structures 402 are being formed between the already formed, first interconnect vias 116. In some embodiments, the metal encapsulation layer 502 may also aid in the isolation between the first interconnect vias 116 by, for example, reducing the electromigration, resistivity, or some other property of the first interconnect vias 116. In some embodiments, wherein the first interconnect dielectric layer 114 is formed after the formation of the first interconnect via 116, damage to the first interconnect dielectric layer 114 may be mitigated.

Further, in some embodiments, the lower interconnect via 204 may be coupled to a semiconductor device 504. In some embodiments, the underlying semiconductor device 504 may comprise, for example, a field effect transistor (FET). In such embodiments, the semiconductor device 504 may comprise source/drain regions 506 arranged on or within the substrate 102. The source/drain regions 506 may comprise doped portions of the substrate 102. Further, in some embodiments, the semiconductor device 504 may comprise a gate electrode 508 arranged over the substrate 102 and between the source/drain regions 506. In some embodiments, a gate dielectric layer 510 may be arranged directly between the gate electrode 508 and the substrate 102. In some embodiments, the lower interconnect via 106 is coupled to one of the source/drain regions 506, whereas in other embodiments, the lower interconnect via 106 may be coupled to the gate electrode 508 of the semiconductor device 504. Further in some embodiments, it will be appreciated that the electrical interconnect structure 104 may couple the semiconductor device 504 to some other semiconductor device, memory device, photo device, or some other electronic device. It will be appreciated that other electronic/semiconductor devices other than the FET illustrated as the semiconductor device 504 are also within the scope of this disclosure, such as, for example, gate all around FETs, finFETs, or the like.

In some embodiments, the thermal interconnect structure advantageously directs heat away from the semiconductor device 504 and towards the thermal passivation layer 142 to escape the integrated chip. Thus, the thermal interconnect structure also reduces thermal damage to the semiconductor device 504 to increase the reliability of the semiconductor device 504 and the overall integrated chip.

Figure 6:
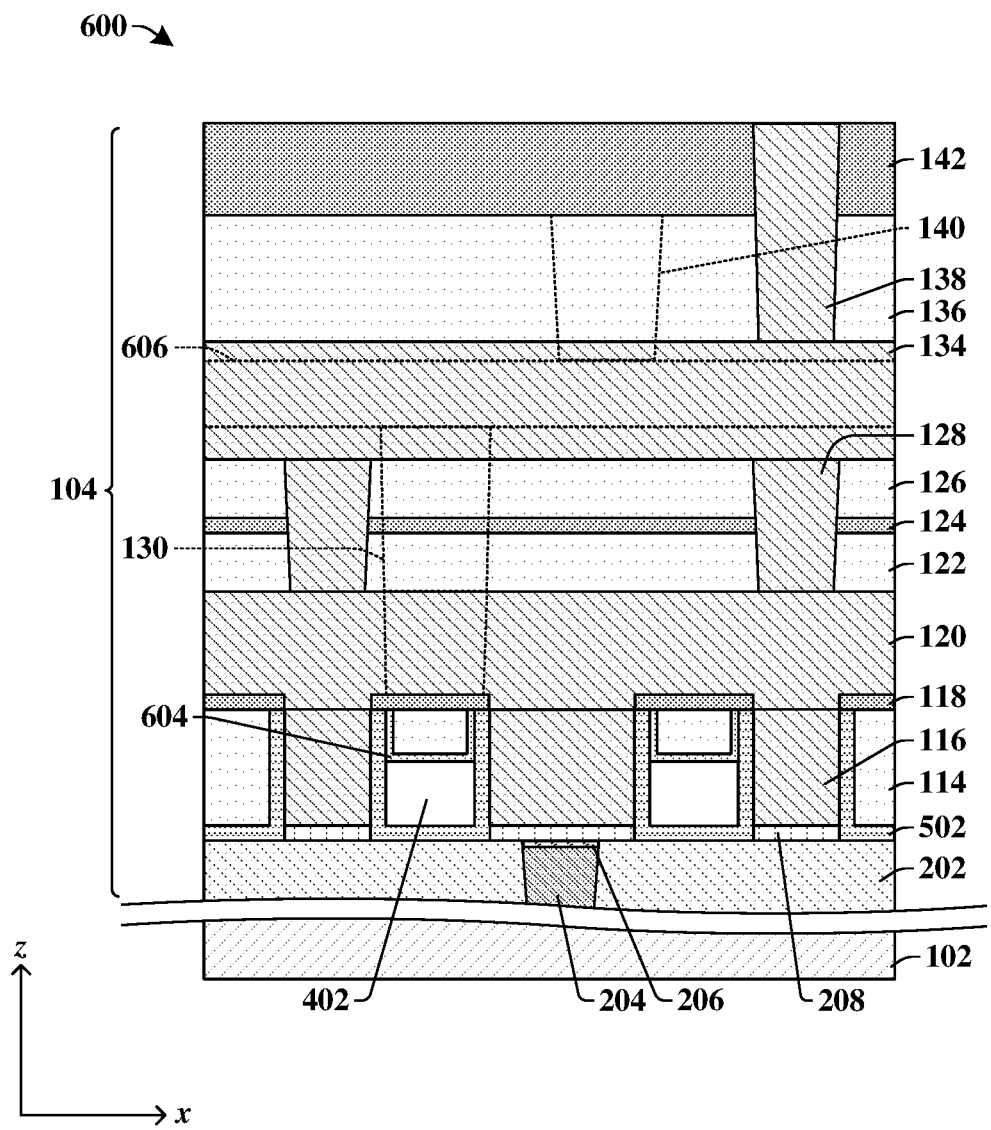

FIG. 6 illustrates a cross-sectional view 600 of yet some other embodiments of an integrated chip comprising air spacer structures and a thermal interconnect structure within an electrical interconnect structure.

In some embodiments, the thermal interconnect structure further comprises a thermal wire 606. In some embodiments, the thermal wire 606 may be arranged behind the interconnect vias (204, 116, 128, 138), the interconnect wires (120, 134), and/or the interconnect dielectric layers (202, 114, 122, 126, 136) of the electrical interconnect structure 104. In such embodiments, the thermal wire 606 may also comprise, for example, aluminum nitride, aluminum oxide, silicon nitride, silicon carbide, magnesium oxide, beryllium oxide, boron nitride, diamond, or some other suitable insulator (i.e., not conductive) material that is different than the material(s) of the interconnect dielectric layers (202, 114, 122, 126, 136) and that has a higher thermal conductivity than the material(s) of the interconnect dielectric layers (202, 114, 122, 126, 136). Thus, in some embodiments, the thermal interconnect structure may comprise thermal vias (130, 140), thermal layers (118, 124), and/or thermal wires (606) that are continuously coupled to the thermal passivation layer 142.

Further, in some embodiments, the air spacer structures 402 may have outer sidewalls and bottom surfaces defined by the metal encapsulation layer and may have top surfaces defined by an additional capping layer 604. In some embodiments, the additional capping layer 604 surrounds outer sidewalls and bottom surfaces of portions of the first interconnect dielectric layer 114. In some embodiments, the additional capping layer 604 directly contacts the metal encapsulation layer 502. In some embodiments, the air spacer structures 402 are formed prior to the first interconnect dielectric layer 114.

In some embodiments, the capping layer 206, the metal encapsulation layer 502, and/or the additional capping layer 604 comprise same or different materials, such as, for example, aluminum, zirconium, yttrium, silicon, an oxide, a carbide, a nitride, or some other suitable material. In some embodiments, the glue layer 208 may comprise, for example, titanium nitride, tantalum nitride, silicon nitride, or some other suitable material that aids in the adhesion to the capping layer 206 and the first interconnect via 116.

FIGS. 7-28 illustrate cross-sectional views 700-2800 of some embodiments of a method of forming an integrated chip having a thermal interconnect structure arranged throughout an electrical interconnect structure. Although FIGS. 7-28 are described in relation to a method, it will be appreciated that the structures disclosed in FIGS. 7-28 are not limited to such a method, but instead may stand alone as structures independent of the method.

FIGS. 7-10 illustrate cross-sectional views 700-1000 a first set of processing steps to form air spacer structures between interconnect vias in an electrical interconnect structure.

Figure 7:
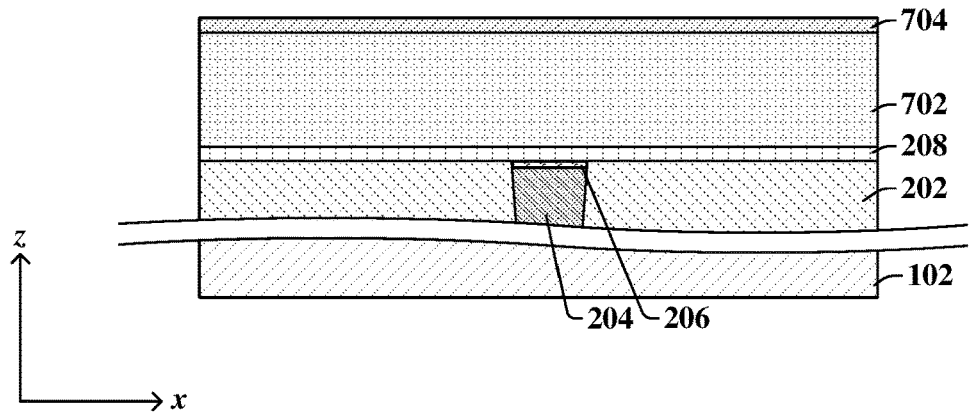
FIGS. 7-28 illustrate various views of some embodiments of a method of forming an integrated chip having a thermal interconnect structure arranged throughout an electrical interconnect structure, wherein the thermal interconnect structure provides a thermal dissipation path for heat to escape the integrated chip before damaging the integrated chip.

As shown in cross-sectional view 700 of FIG. 7, a substrate 102 is provided. In some embodiments, the substrate 102 may be or comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or associated with. In some embodiments, various semiconductor devices (e.g., transistors, inductors, capacitors, etc.) and/or memory devices (not shown) may be arranged over and/or within the substrate 102. In some embodiments, a lower interconnect dielectric layer 202 is formed over the substrate 102, and a lower interconnect via 204 may be formed within the lower interconnect dielectric layer 202 and coupled to the one or more various semiconductor devices and/or memory devices (not shown).

In some embodiments, the lower interconnect dielectric layer 202 may be formed by way of a deposition process (e.g., spin-on, physical vapor deposition (PVD), chemical vapor deposition (CVD), atomic layer deposition (ALD), etc.). In some embodiments, the lower interconnect dielectric layer 202 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the lower interconnect via 204 may be formed within the lower interconnect dielectric layer 202 through various steps of patterning (e.g., photolithography/etching), deposition (e.g., PVD, CVD, plasma-enhanced CVD (PE-CVD), ALD, sputtering, etc.), and removal (e.g., wet etching, dry etching, chemical mechanical planarization (CMP), etc.) processes. In some embodiments, the lower interconnect via 204 may comprise a conductive material such as, for example, tantalum, tantalum nitride, titanium nitride, copper, cobalt, ruthenium, molybdenum, iridium, tungsten, or some other suitable conductive material. In some embodiments, a capping layer 206 may also be over the lower interconnect via 204 and may comprise, for example, cobalt, copper, aluminum, or some other suitable metal. In some such embodiments, the capping layer 206 may be formed through various steps of patterning (e.g., photolithography/etching), deposition (e.g., PVD, CVD, PE-CVD, ALD, sputtering, etc.), and removal (e.g., wet etching, dry etching, CMP, etc.) processes.

In some embodiments, a glue layer 208 may be formed over the lower interconnect via 204 and the lower interconnect dielectric layer 02. In some embodiments, the glue layer 208 may be formed by way of, for example, a deposition process (e.g., PVD, CVD, PE-CVD, ALD, sputtering, etc.). In some embodiments, the glue layer 208 comprises, for example, titanium nitride, tantalum nitride, silicon nitride, or some other suitable material.

In some embodiments, a sacrificial layer 702 may be formed over the glue layer 208. In some embodiments, the sacrificial layer 702 may comprise a silicon dioxide, silicon oxygen carbide, or some other suitable material. In some embodiments, a hard mask layer 704 may be formed over the sacrificial layer 702. In some embodiments, the hard mask layer 704 may comprise, for example, silicon nitride, silicon oxynitride, silicon carbide, or some other suitable hard mask material. In some embodiments, the sacrificial layer 702 and the hard mask layer 704 may each be formed by way of a deposition process (e.g., spin-on, PVD, CVD, ALD, etc.).

Figure 8:
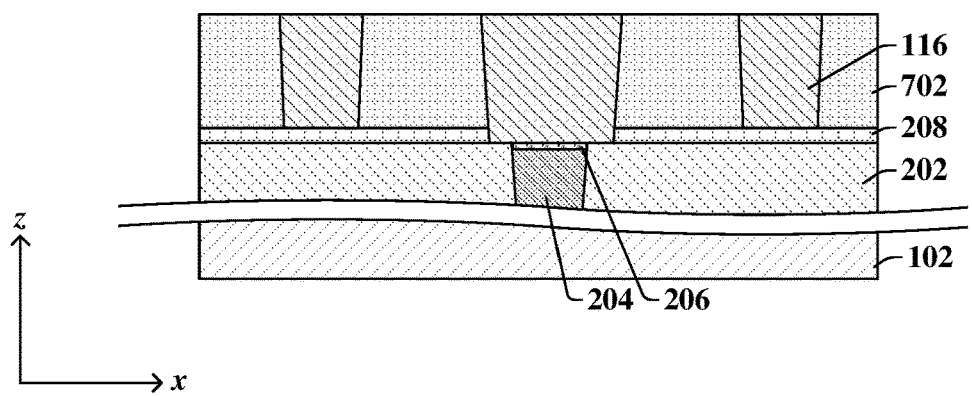

As shown in cross-sectional view 800 of FIG. 8, in some embodiments, first interconnect vias 116 are formed within the sacrificial layer 702. In some such embodiments, the first interconnect vias 116 may be formed through various steps of patterning (e.g., photolithography/etching), deposition (e.g., PVD, CVD, PE-CVD, ALD, sputtering, etc.), and removal (e.g., wet etching, dry etching, CMP, etc.) processes. For example, in some embodiments, the hard mask layer (704 of FIG. 7) may be patterned using photolithography processes, and then, according to the patterned hard mask layer, portions of the sacrificial layer 702 may be removed. In some embodiments, a conductive material is then deposited to form the first interconnect vias 116. In some embodiments, one of the first interconnect vias 116 extend through the glue layer 208 to electrically contact the lower interconnect via 204. In some embodiments, excess of the conductive material and the patterned hard mask layer are removed from the sacrificial layer 702 by way of a planarization process (e.g., CMP). In some embodiments, the glue layer 208 acts as an etch stop layer during the formation of the first interconnect vias 116 to protect the lower interconnect dielectric layer 202 from removal processes. In some embodiments, because the first interconnect vias 116 are formed within openings of the sacrificial layer 702, the first interconnect vias 116 may have upper surfaces that are wider than bottom surfaces. In some embodiments, the first interconnect vias 116 comprise, for example, tantalum, tantalum nitride, titanium nitride, copper, cobalt, ruthenium, molybdenum, iridium, tungsten, or some other suitable conductive material.

Figure 9:
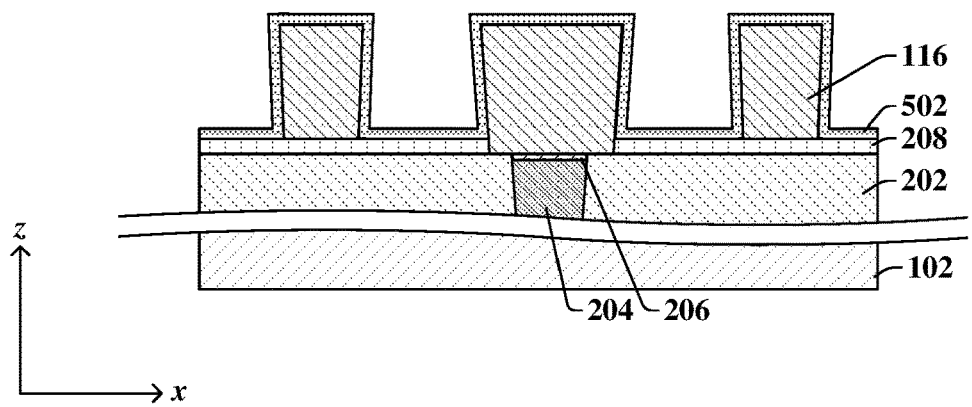

As shown in cross-sectional view 900 of FIG. 9, in some embodiments, the sacrificial layer (702 of FIG. 8) is removed and a metal encapsulation layer 502 is formed over the first interconnect vias 116 and the glue layer 208. In some embodiments, the sacrificial layer (702 of FIG. 7) is removed by way of a wet or dry etching process. In some embodiments, the metal encapsulation layer 502 is formed by way of a deposition process (e.g., PVD, CVD, ALD, etc.), and may have a thickness in a range of between, for example, approximately 1 nanometer and approximately 5 nanometers. In some embodiments, the metal encapsulation layer 502 may comprise, for example, aluminum, zirconium, yttrium, silicon, an oxide, a carbide, a nitride, or some other suitable material.

Figure 10:
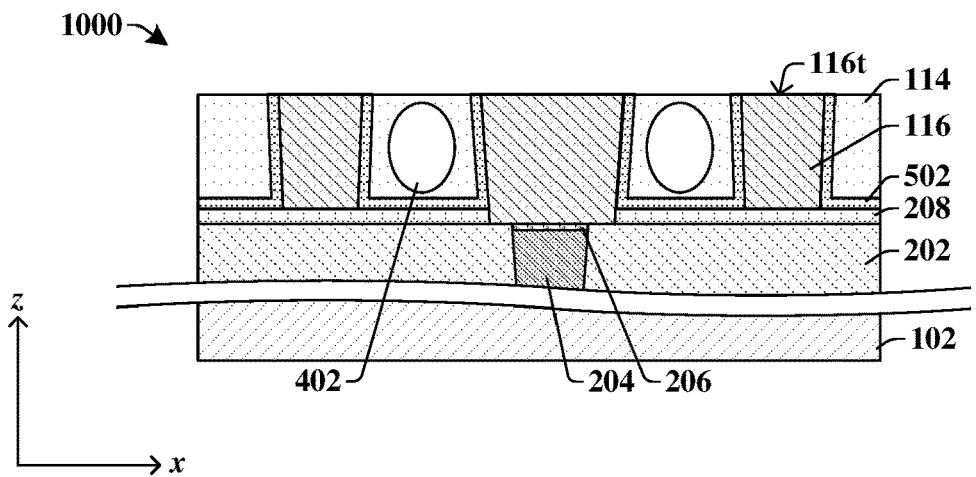

As shown in cross-sectional view 1000 of FIG. 10, in some embodiments, a first interconnect dielectric layer 114 is formed over the lower interconnect dielectric layer 202 and between the first interconnect vias 116. In some embodiments, the lower interconnect dielectric layer 202 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first interconnect dielectric layer 114 improves the electrical isolation between the first interconnect vias 116. By forming the first interconnect dielectric layer 114 after the first interconnect vias 116, damage to the first interconnect dielectric layer 114 may be mitigated thereby increasing the electrical isolation between the first interconnect vias 116 provided by the first interconnect dielectric layer 114.

In some embodiments, to further improve the electrical isolation and reduce capacitance between the first interconnect vias 116, air spacer structures 402 are formed within the first interconnect dielectric layer 114 and between the first interconnect vias 116. The air spacer structures 402 comprise a cavity filled with air or some other suitable gas. The air spacer structures 402 have a lower dielectric constant than the first interconnect dielectric layer 114, in some embodiments, to increase the electrical isolation between the first interconnect vias 116. In some embodiments, the air spacer structures 402 and the first interconnect dielectric layer 114 may be formed together by way of a suitable formation process. For example, in some embodiments, the suitable formation process may include a non-conformal deposition process such as, for example, plasma-enhanced chemical vapor deposition (PE-CVD). Non-conformal deposition processes create gaps of air in recessed areas such as between adjacent first interconnect vias 116 to form the air spacer structures 402. It will be appreciated that other processing methods than PE-CVD to form the air spacer structures 402 within the first interconnect dielectric layer 114 are also within the scope of this disclosure.

In some embodiments, excess material of the first interconnect dielectric layer 114 may be arranged over the first interconnect vias 116. In such embodiments, the excess material of the first interconnect dielectric layer 114 is removed by way of a planarization process (e.g., CMP). In some embodiments, during the planarization process (e.g., CMP), portions of the metal encapsulation layer 502 arranged on topmost surfaces 116t of the first interconnect vias 116 are removed.

Alternatively, FIGS. 11-14 illustrate cross-sectional views 1100-1400 of some other embodiments of forming air spacer structures between first interconnect vias. Thus, in some embodiments, the method utilizes the steps in FIGS. 11-14 instead of the steps of FIGS. 7-10 to form air spacer structures between first interconnect vias.

Figure 11:
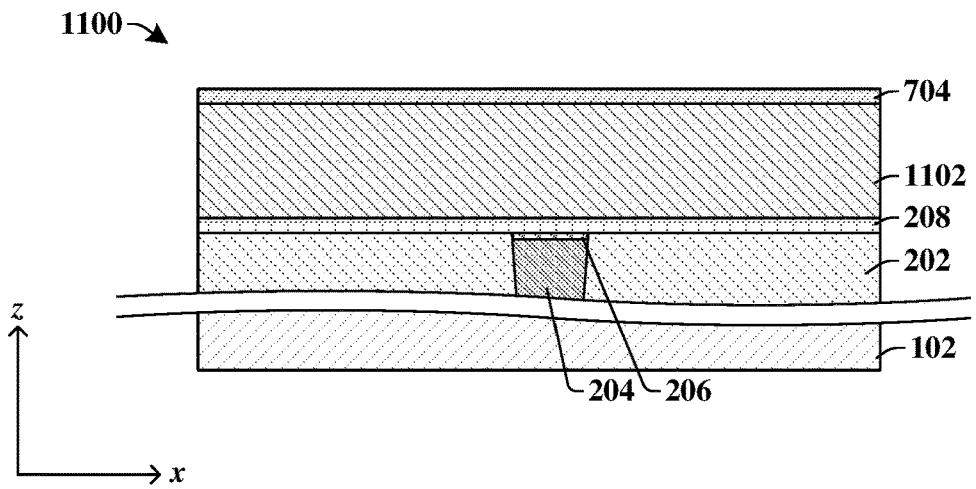

As shown in cross-sectional view 1100 of FIG. 11, in some embodiments, a lower interconnect via 204 and capping layer 206 may be formed within a lower interconnect dielectric layer 202 as described in FIG. 7, for example. Further, in some embodiments, a glue layer 208 may be formed over the lower interconnect dielectric layer 202 as described in FIG. 7. In some embodiments, a conductive layer 1102 is formed over the glue layer 208. In some embodiments, the conductive layer 1102 may comprise, for example, tantalum, tantalum nitride, titanium nitride, copper, cobalt, ruthenium, molybdenum, iridium, tungsten, or some other suitable conductive material. In some embodiments, the conductive layer 1102 may be formed by way of a deposition process (e.g., PVD, CVD, ALD, sputtering, etc.). In some embodiments, a hard mask layer 704 is then formed over the conductive layer 1102 as described in FIG. 7, for example.

Figure 12:
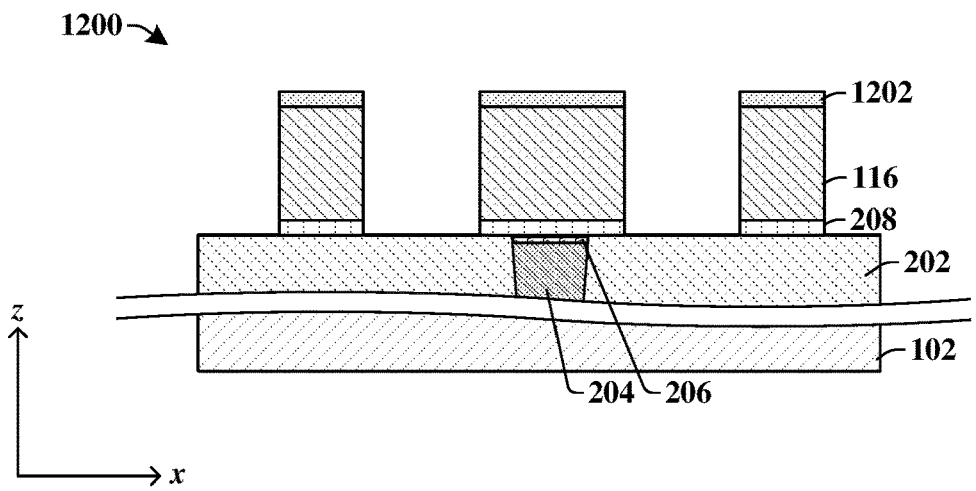

As shown in cross-sectional view 1200 of FIG. 12, in some embodiments, a patterning process (e.g., photolithography, etching) is performed on the hard mask layer (704 of FIG. 11) to form a patterned hard mask layer 1202, and then, a removal process is performed according to the patterned hard mask layer 1202 to form first interconnect vias 116 from the conductive layer (1102 of FIG. 11). In some embodiments, the removal process of FIG. 12 removes portions of the conductive layer (1102 of FIG. 11) and the glue layer 208 that do not directly underlie the patterned hard mask layer 1202. In some other embodiments, the glue layer 208 may be resistant to removal by the removal process of FIG. 12 to protect the lower interconnect dielectric layer 202. In some embodiments, the removal process is a reactive-ion etching process. In some embodiments, using the reactive-ion etching process to form the first interconnect vias 116 is useful as the critical dimension of the first interconnect vias 116 decrease. In some embodiments, the glue layer 208 is arranged directly between the first interconnect via 116 and the lower interconnect via 204, whereas in other embodiments, portions of the glue layer 208 may be removed prior to the formation of the conductive layer (1102), such that the first interconnect via 116 directly contacts the capping layer 206 on the lower interconnect via 204.

Figure 13:
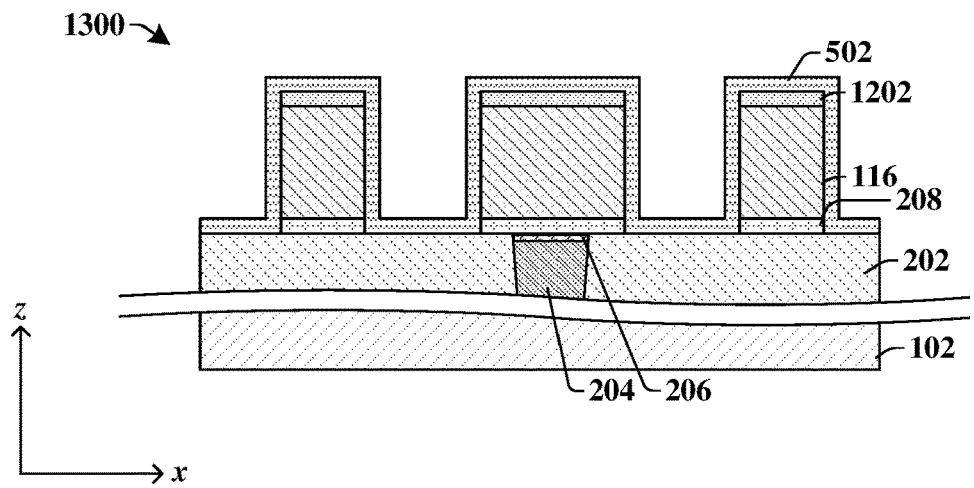

As shown in cross-sectional view 1300 of FIG. 13, a metal encapsulation layer 502 is formed over the first interconnect vias 116 and the lower interconnect dielectric layer 202. In some embodiments, the patterned hard mask layer 1202 remains on the first interconnect vias 116, and thus, the metal encapsulation layer 502 may be formed over the patterned hard mask layer 1202. In some embodiments, the metal encapsulation layer of FIG. 13 may comprise the same material and be formed the same way as described in FIG. 9.

Figure 14:
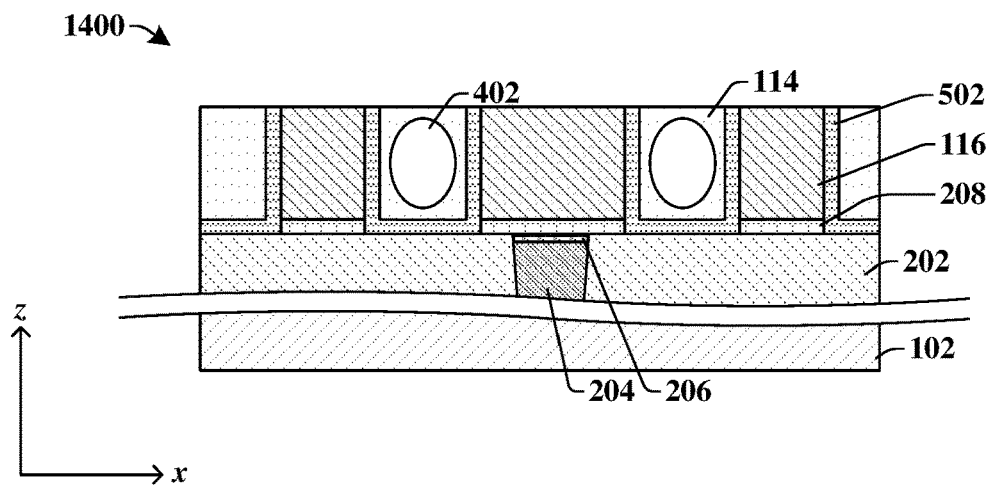

As shown in cross-sectional view 1400 of FIG. 14, in some embodiments, a first interconnect dielectric layer 114 and air spacer structures 402 embedded within the first interconnect dielectric layer 114 are formed between the first interconnect vias 116. In some embodiments, the formation of the air spacer structures 402 and the first interconnect dielectric layer 114 may be achieved through various methods as described in FIG. 10. In some embodiments, after the formation of the air spacer structures 402 and the first interconnect dielectric layer 114, a planarization process (e.g., CMP) may be performed to remove the patterned hard mask layer 1202 and portions of the metal encapsulation layer 502 arranged over the first interconnect vias 116.

Alternatively, FIGS. 15-19 illustrate cross-sectional views 1500-1900 of yet some other embodiments of forming air spacer structures between first interconnect vias. In some embodiments, FIG. 15 proceeds after FIG. 9, thereby skipping the steps in FIGS. 10-14 or FIG. 15 proceeds after FIG. 13, thereby skipping the steps in FIG. 14.

Figure 15:
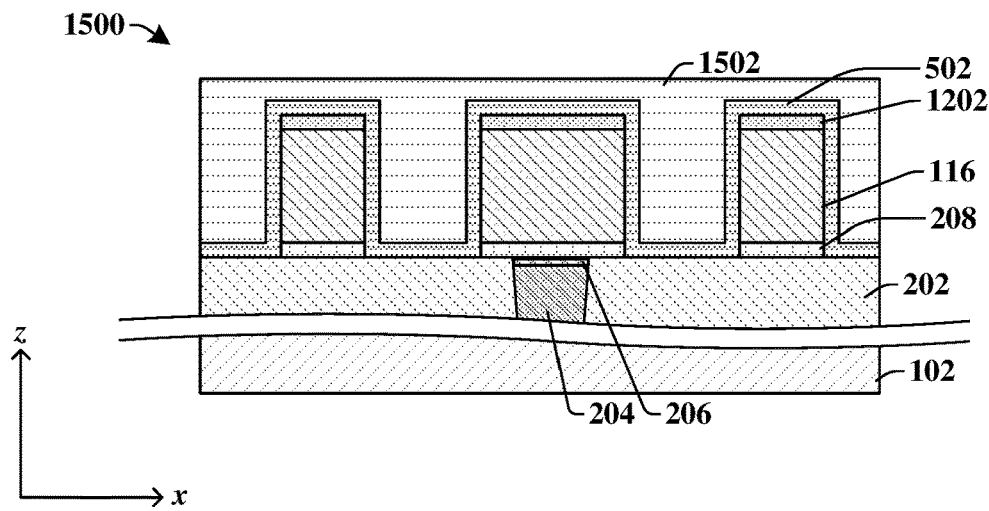

As shown in the cross-sectional view 1500 of FIG. 15, in some embodiments, after the formation of a metal encapsulation layer 502 over first interconnect vias 116, an organic sacrificial layer 1502 is formed over the metal encapsulation layer 502. In some embodiments, the organic sacrificial layer 1502 may be a polymeric material and thus, comprise carbon. In some embodiments, the organic sacrificial layer 1502 is formed by way of a deposition process such as, for example, CVD, ALD, spin-on, or some other suitable deposition process. In some embodiments, the thickness of the organic sacrificial layer 1502 may be controlled by, for example, time of the deposition process.

Figure 16:
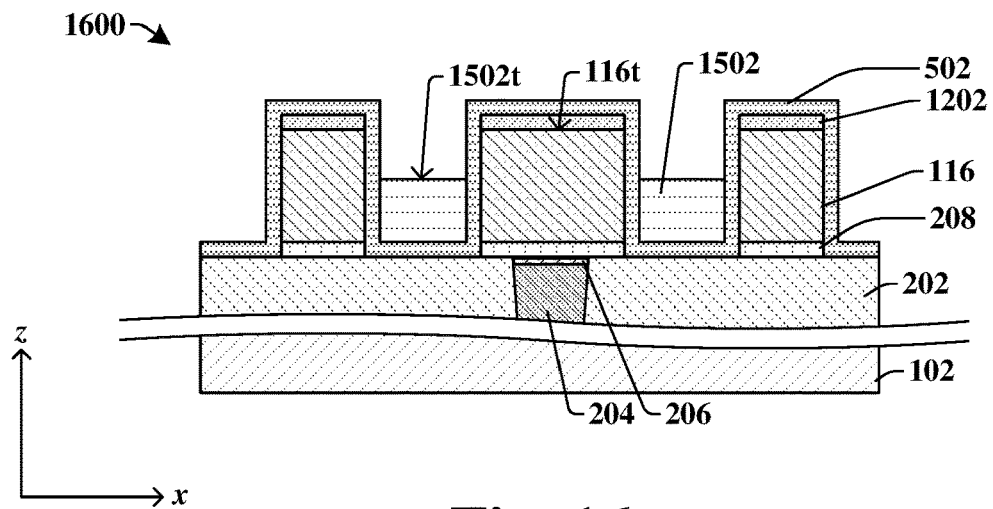

As shown in cross-sectional view 1600 of FIG. 16, in some embodiments, if the organic sacrificial layer 1502 is formed in FIG. 15 to extend above the first interconnect vias 116, a removal process may be performed such that the organic sacrificial layer 1502 has topmost surfaces 1502t that are below topmost surfaces 116t of the first interconnect vias 116. In some embodiments, the removal process of FIG. 16 comprises, for example, a thermal etching back process or a wet or dry etching process. In other embodiments, if the formation of the organic sacrificial layer 1502 is more controlled in FIG. 15 such that the organic sacrificial layer 1502 has topmost surfaces 1502t that are below topmost surfaces 116t of the first interconnect vias 116, the removal process of FIG. 16 may be omitted.

Figure 17:
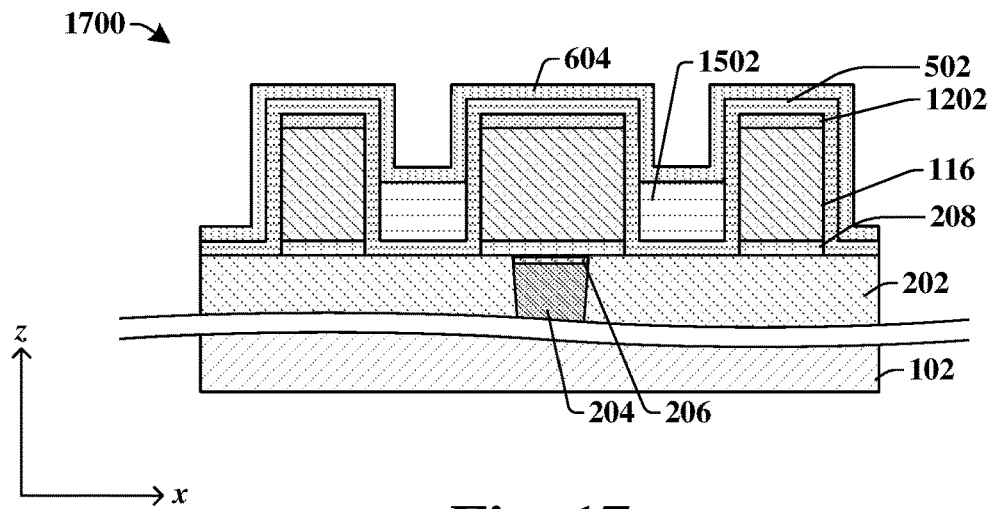

As shown in cross-sectional view 1700 of FIG. 17, in some embodiments, an additional capping layer 604 is formed over the metal encapsulation layer 502. In some embodiments, the additional capping layer comprises, for example, aluminum, zirconium, yttrium, silicon, an oxide, a carbide, a nitride, or some other suitable material. In some embodiments, the additional capping layer 604 may be formed by way of a deposition process such as, for example, CVD, ALD, or some other suitable deposition process.

Figure 18:
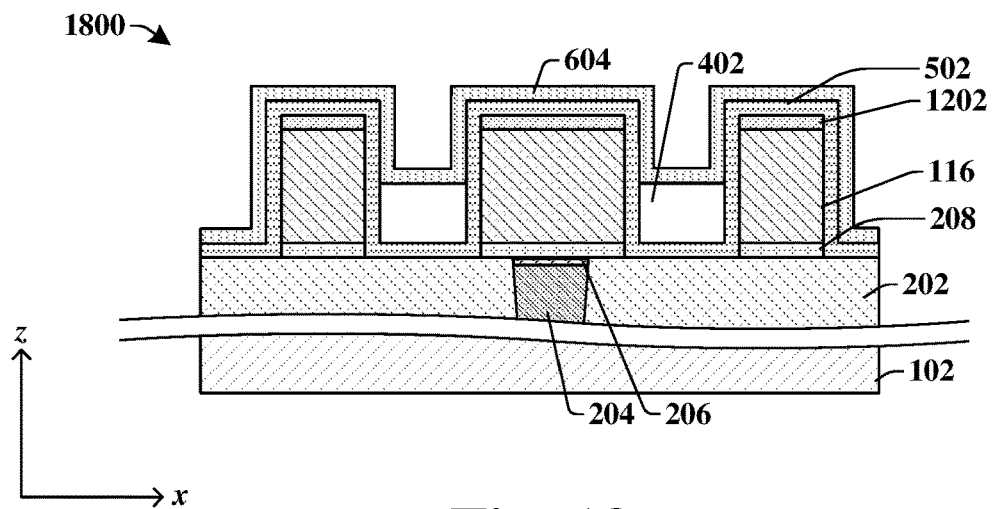

As shown in cross-sectional view 1800 of FIG. 18, in some embodiments, the organic sacrificial layer (1502 of FIG. 17) is completely removed leaving behind air spacer structures 402 defined by the metal encapsulation layer 502 and the additional capping layer 604. In some embodiments, the organic sacrificial layer (1502 of FIG. 17) may be removed by a thermal (e.g., baking) process, a laser, UV light, or some other suitable process.

Figure 19:
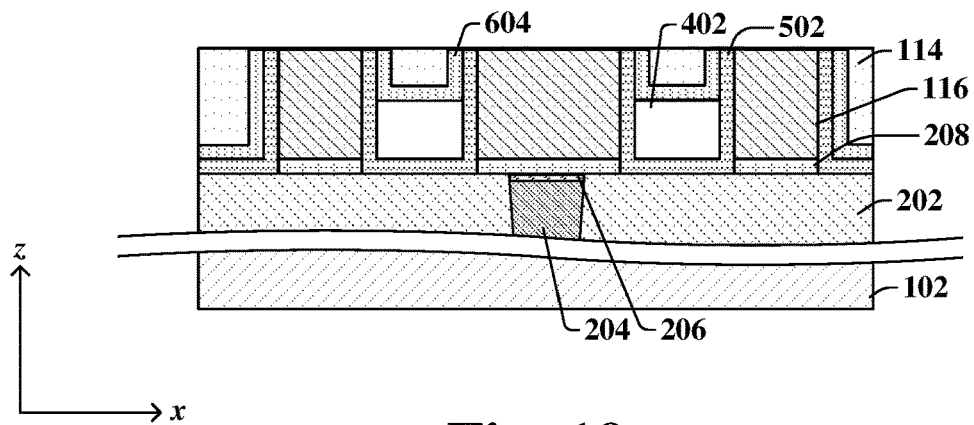

As shown in cross-sectional view 1900 of FIG. 19, in some embodiments, a first interconnect dielectric layer 114 may be formed over the additional capping layer 604. In some embodiments, the first interconnect dielectric layer 114 may be formed by way of a deposition process (e.g., PVD, CVD, ALD, etc.) and may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, after the deposition of the first interconnect dielectric layer 114, a planarization process (e.g., CMP) is performed to remove portions of the patterned hard mask layer (1202 of FIG. 18), the metal encapsulation layer 502, the additional capping layer 604, and/or the first interconnect dielectric layer 114 arranged over the first interconnect vias 116.

Further, in yet some other embodiments (not shown), the first interconnect vias 116 may be formed in the first interconnect dielectric layer 114 by way of a damascene process. In such other embodiments, the first interconnect vias 116 may be formed after the first interconnect dielectric layer 114, and the formation of the air spacer structures 402 may be omitted.

Figure 20:
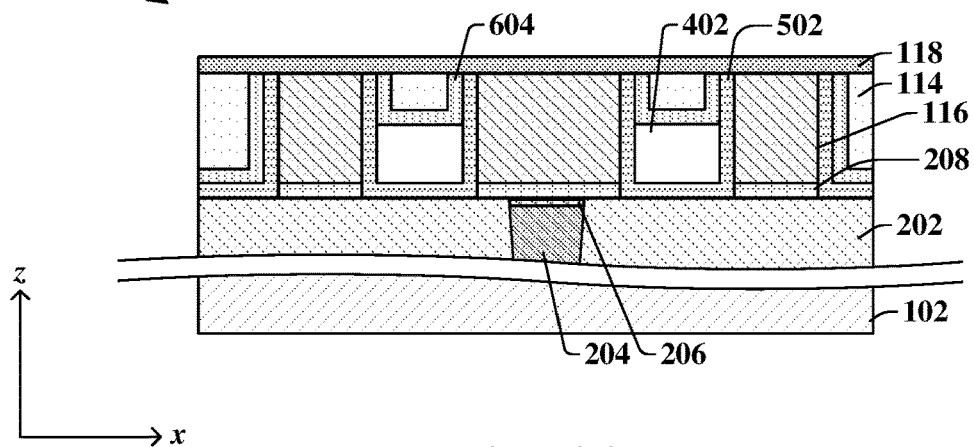

FIGS. 20-28 illustrate various views 2000-2800 of some embodiments of the remaining steps of forming a thermal interconnect structure within an electrical interconnect structure. In some embodiments, the method may proceed from FIG. 10 to FIG. 20; in some other embodiments, the method may proceed from FIG. 14 to FIG. 20; and in yet some other embodiments, the method may proceed from FIG. 19 to FIG. 20. Here, FIG. 20 illustrates a cross-sectional view 2000 proceeding from the cross-sectional view 1900 of FIG. 19. It will be appreciated that the steps illustrated in FIGS. 20-28 may be applied to various different embodiments, such as those illustrated in FIGS. 11 and 14, for example.

As shown in the cross-sectional view 2000 of FIG. 20, in some embodiments, a first thermal layer 118 is formed over the first interconnect vias 116 and the first interconnect dielectric layer 114. In some embodiments, the first thermal layer 118 comprises a different material than the first interconnect dielectric layer 114, comprises a material that has a higher thermal conductivity than the first interconnect dielectric layer 114, and comprises a material that is not conductive. In some embodiments, for example, the first thermal layer 118 may comprise aluminum nitride, aluminum oxide, silicon nitride, silicon carbide, magnesium oxide, beryllium oxide, boron nitride, diamond, or some other suitable material. In some embodiments, the first thermal layer 118 may be formed by way of a deposition process (e.g., PVD, CVD, ALD, electroplating, spin-on, electro-less plating, etc.).

Figure 21:
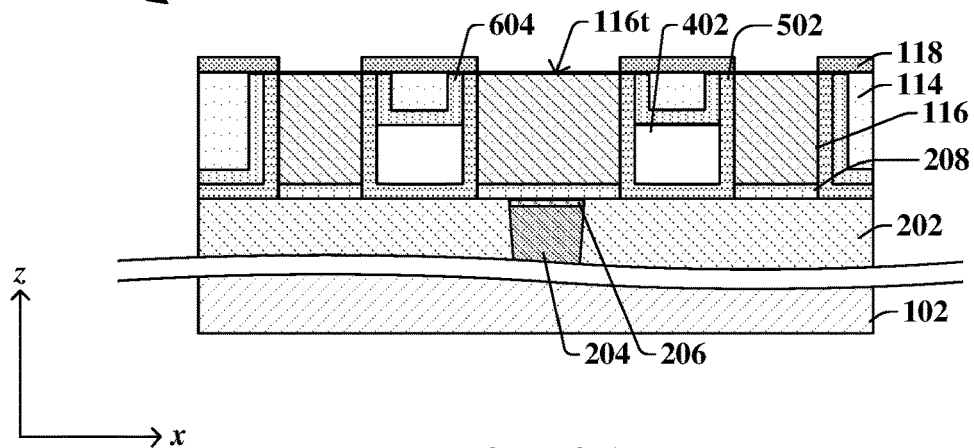

As shown in cross-sectional view 2100 of FIG. 21, in some embodiments, a removal process is performed to remove portions of the first thermal layer 118 that directly overlie the topmost surfaces 116t of the first interconnect vias 116. In other embodiments, the first thermal layer 118 may be selectively formed on the additional capping layer 604, the metal encapsulation layer 502, and/or the first interconnect dielectric layer 114 and thus, not formed on the first interconnect vias 116. In such embodiments, the removal process of FIG. 21 may be omitted.

Figure 22:
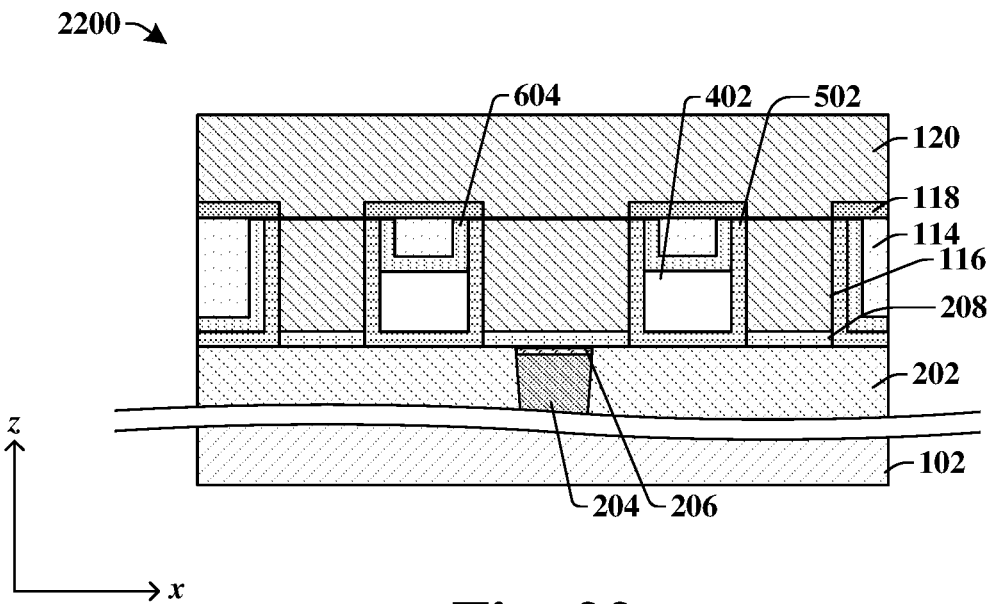

As shown in cross-sectional view 2200 of FIG. 22, in some embodiments, a first interconnect wire 120 is formed over the first thermal layer 118. In some embodiments, the first interconnect wire 120 is formed by way of a deposition process (e.g., PVD, CVD, ALD, sputtering, etc.). In some embodiments, the first interconnect wire 120 is formed within a cavity of another interconnect dielectric layer (not shown) arranged over the first interconnect dielectric layer 114. In some embodiments, the first interconnect wire 120 is coupled to one or more of the first interconnect vias 116. Thus, in some embodiments, the first interconnect wire 120 extends through the first thermal layer 118 to contact the first interconnect vias 116. In some embodiments, the first interconnect wire 120 comprises, for example, tantalum, tantalum nitride, titanium nitride, copper, cobalt, ruthenium, molybdenum, iridium, tungsten, or some other suitable conductive material.

Figure 23:
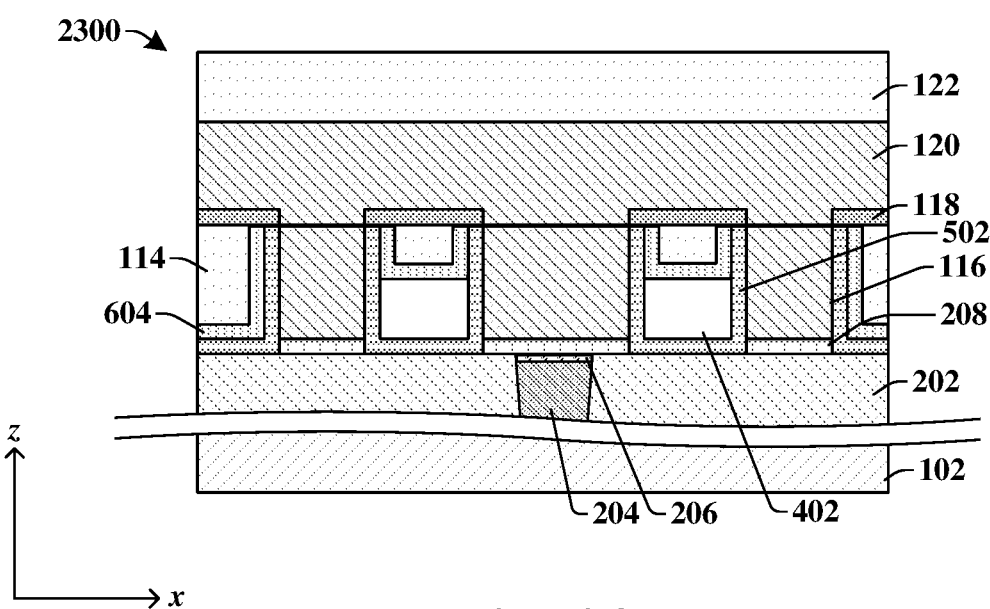

As shown in cross-sectional view 2300 of FIG. 23, in some embodiments, a second interconnect dielectric layer 122 is formed over the first interconnect wires 120. In some embodiments, the second interconnect dielectric layer 122 may be formed using a same or similar deposition process as the formation of the first interconnect dielectric layer 114 and may comprise a same or similar material as the first interconnect dielectric layer 114. In some embodiments, the first thermal layer 118 comprises a material that has a higher thermal conductivity than the second interconnect dielectric layer 122.

Figure 24A:
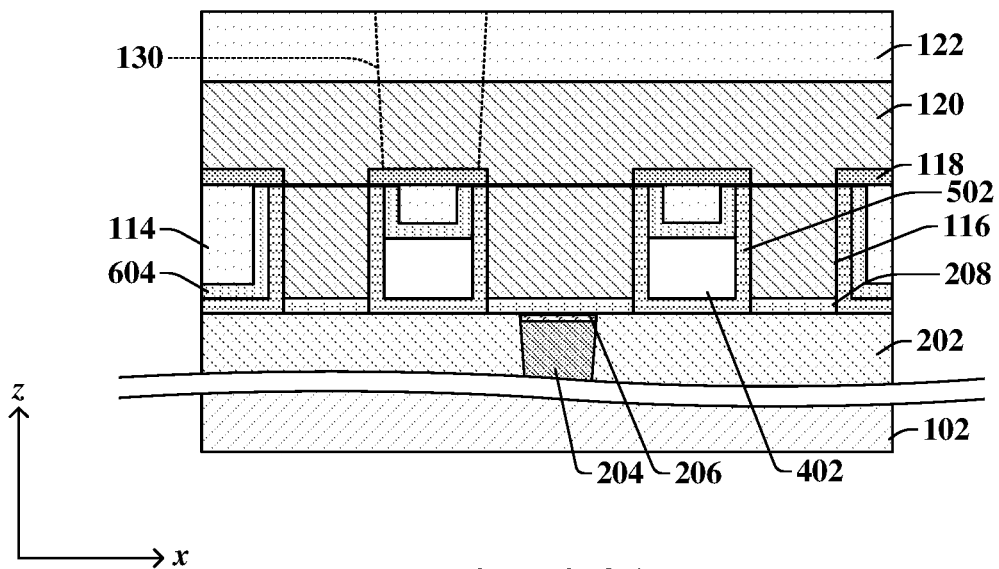

As shown in cross-sectional view 2400A of FIG. 24A, in some embodiments, a first thermal via 130 is formed through the second interconnect dielectric layer 122 to directly contact the first thermal layer 118. In some embodiments, the first thermal via 130 is formed behind the first interconnect wire 120, and thus, the first thermal via 130 is illustrated with dotted lines in the cross-sectional view 2400A of FIG. 24A. In some embodiments, the first thermal via 130 is formed through various steps of patterning (e.g., photolithography/etching), deposition (e.g., PVD, CVD, ALD, electroplating, spin-on, electro-less plating, etc.), and removal (e.g., wet etching, dry etching, chemical mechanical planarization (CMP), etc.) processes. For example, in some embodiments, a masking structure is formed over the second interconnect dielectric layer 122 comprising an opening formed through photolithography. Then, portions of the second interconnect dielectric layer 122 are removed according to the opening to expose a portion of the first thermal layer 118, and the first thermal via 130 is formed to directly contact the first thermal layer 118. Any excess material of the first thermal via 130 that is arranged above the second interconnect dielectric layer 122 may be removed by, for example, a planarization process (e.g., CMP), in some embodiments.

In some embodiments, the first thermal via 130 comprises a material with a higher thermal conductivity than the first and second interconnect dielectric layers 114, 122 and that is not conductive. In some embodiments, the thermal via 130 comprises a same or different material as the first thermal layer 118. In some embodiments, the first thermal via 130 may comprise, for example, aluminum nitride, aluminum oxide, silicon nitride, silicon carbide, magnesium oxide, beryllium oxide, boron nitride, diamond, or some other suitable insulator (i.e., not conductive) material.

Figure 24B:
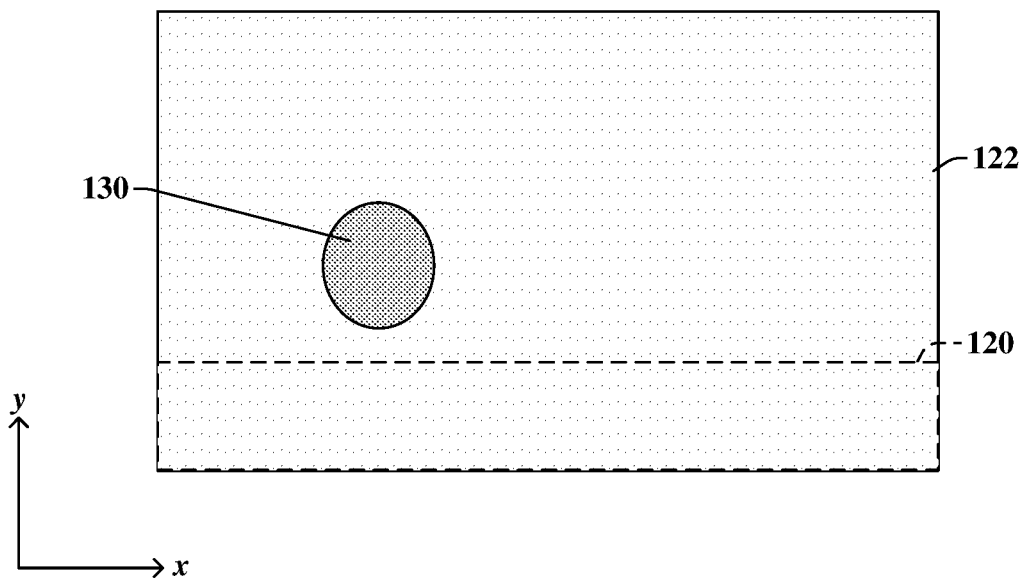

FIG. 24B illustrates some embodiments of a top-view 2400B that may correspond to the cross-sectional view 2400A of FIG. 24A. The top-view 2400B is from the perspective of an xy-plane.

As illustrated in the top-view 2400B of FIG. 24B, in some embodiments, the first thermal via 130 is spaced apart from the first interconnect wire 120 in the y-direction. In some embodiments, the first interconnect wires 120 is covered by the second interconnect dielectric layer 122, and thus, not visible from the top-view 2400B. So, in the top-view 2400B of FIG. 24B, the first interconnect wire 120 is illustrated with hashed lines. In some embodiments, from the top-view 2400B, the first thermal via 130 has a rounded profile, whereas in some other embodiments, the first thermal via 130 may have a square, rectangular, diamond, hexagonal, or some other shaped profile from the top-view 2400B perspective.

Figure 25A:
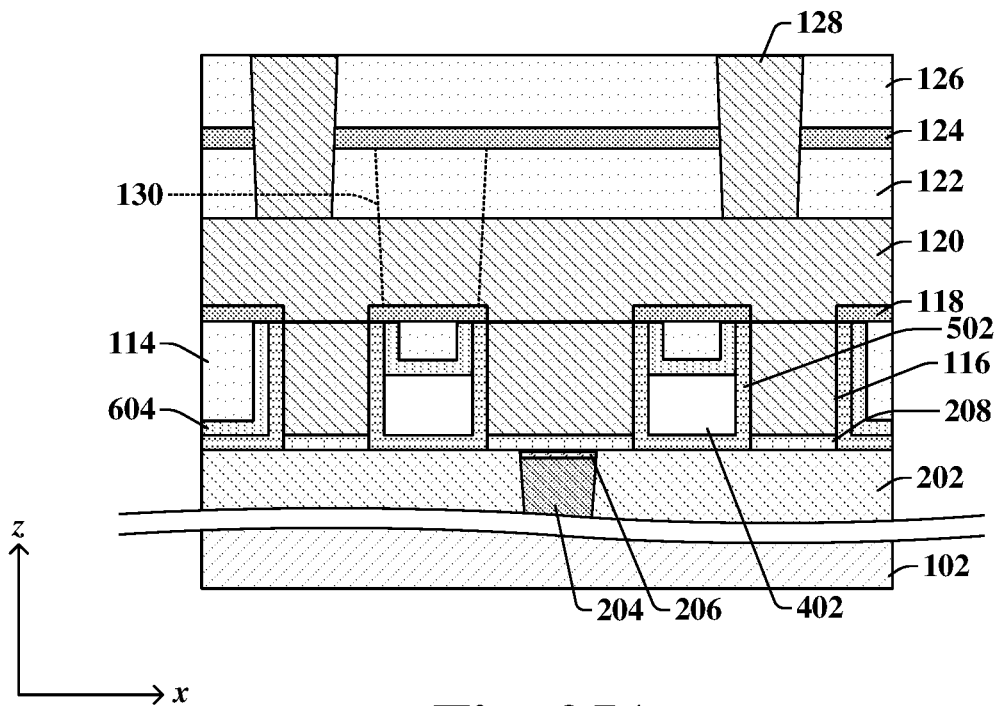

As illustrated in the cross-sectional view 2500A of FIG. 25A, in some embodiments, a second thermal layer 124 is formed over the second interconnect dielectric layer 122, a third interconnect dielectric layer 126 is formed over the second thermal layer 124, and second interconnect vias 128 are formed that extend through the third interconnect dielectric layer 126, the second thermal layer 124, and the second interconnect dielectric layer 122 to contact the first interconnect wire 120. In some embodiments, the second thermal layer 124 comprises similar or the same materials as the first thermal layer 118 and is formed by a similar or same deposition process as the first thermal layer 118. Thus, in some embodiments, the second thermal layer 124 comprises a non-conductive material that has a higher thermal conductivity than the first, second, and third interconnect dielectric layers 114, 122, 126. In some embodiments, the second thermal layer 124 directly contacts the first thermal via 130.

In some embodiments, the third interconnect dielectric layer 126 is formed using the same or similar process as the second interconnect dielectric layer 122 and comprises the same or similar materials as the second interconnect dielectric layer 122. In some embodiments, the second interconnect vias 128 are formed through various steps of patterning (e.g., photolithography/etching), deposition (e.g., PVD, CVD, PE-CVD, ALD, sputtering, etc.), and removal (e.g., wet etching, dry etching, CMP, etc.) processes. In some embodiments, the second interconnect vias 128 comprise a same or similar material as the first interconnect wire 120 and/or the first interconnect vias 116. Further, in some embodiments, the second interconnect vias 128 extend through the second thermal layer 124. Thus, in some embodiments, the second interconnect vias 128 directly contact the second thermal layer 124.

Figure 25B:
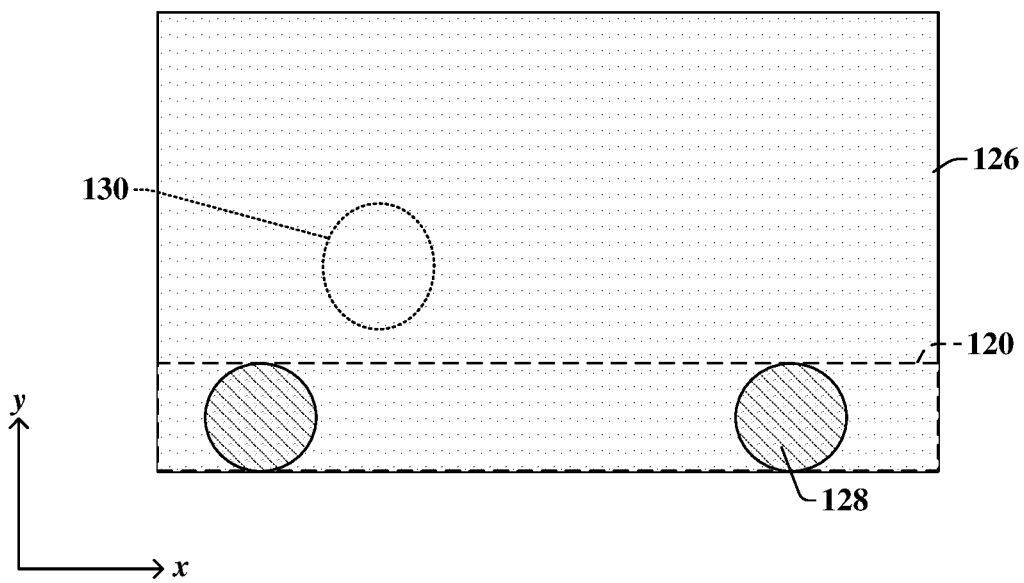
Figure 26:
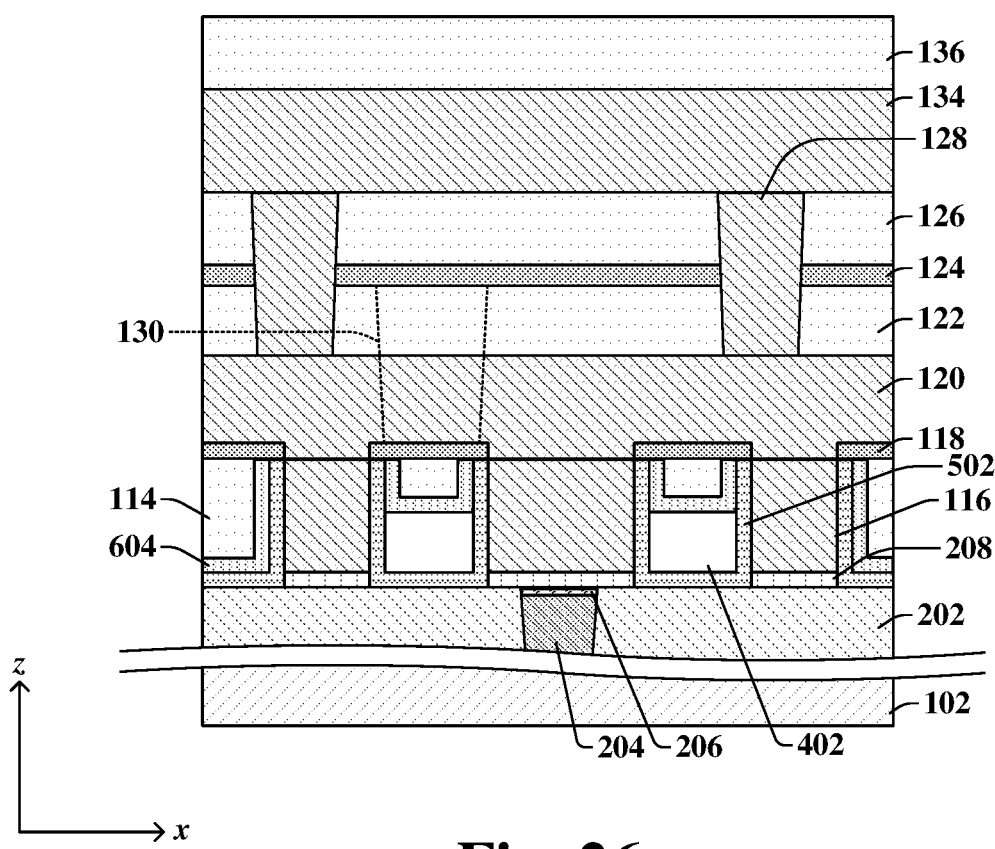

FIG. 25B illustrates some embodiments of a top-view 2500B that may correspond to the cross-sectional view 2500A of FIG. 25A. The top-views 2500B is from the perspective of the xy-plane.

As shown in top-view 2500B of FIG. 25B, in some embodiments, the second interconnect vias 128 are arranged directly over the first interconnect wire 120. Further, in some embodiments, the third interconnect dielectric layer 126 covers the first thermal via 130, and thus, the first thermal via 130 is illustrated with dotted lines in the top-view 2500B of FIG. 25B.

As shown in cross-sectional view 2600, in some embodiments, a second interconnect wire 134 is formed over and coupled to the second interconnect vias 128, and a fourth interconnect dielectric layer 136 is formed over the second interconnect wire 134. In some embodiments, the second interconnect wire 134 may be formed using same or similar steps as the formation of the first interconnect wire 120 described in the cross-sectional view 2200 of FIG. 22, and the second interconnect wire 134 may comprise a same or similar material as the first interconnect wire 120. Also, in some embodiments, the fourth interconnect dielectric layer 136 may be formed using same or similar steps as the formation of the first second interconnect dielectric layer 122 described in the cross-sectional view 2300 of FIG. 23, and the fourth interconnect dielectric layer 136 may comprise a same or similar material as the second interconnect dielectric layer 122.

Figure 27A:
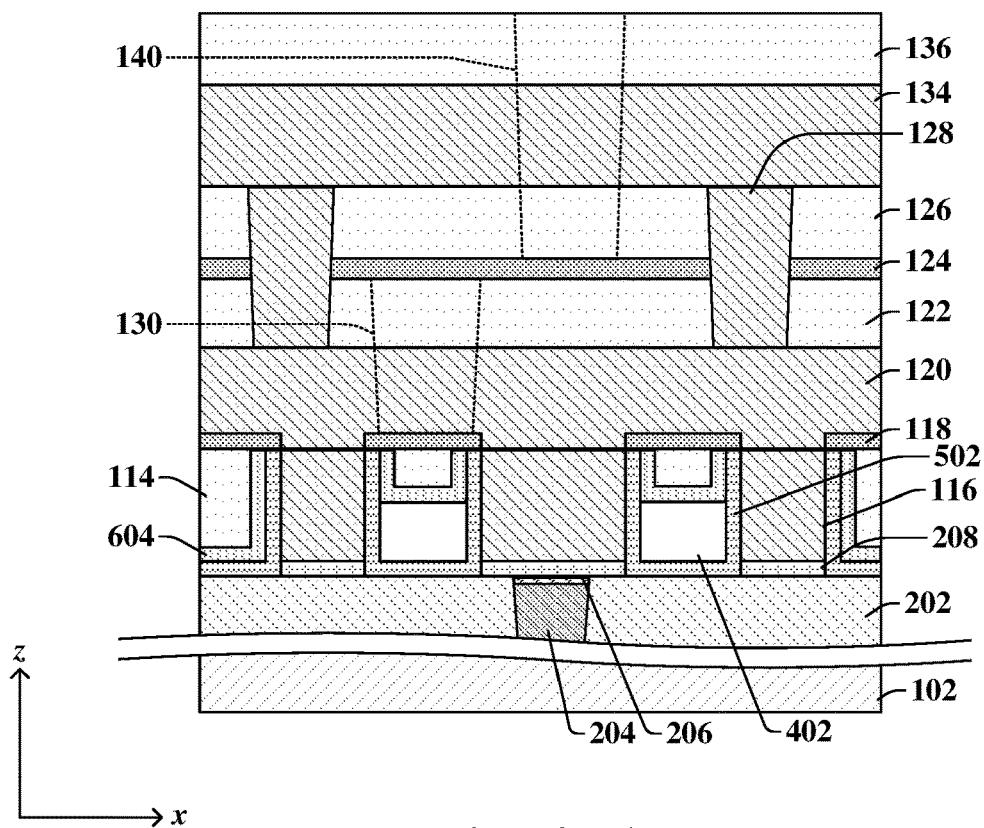

As shown in cross-sectional view 2700A of FIG. 27A, in some embodiments, a second thermal via 140 is formed through the third and fourth interconnect dielectric layers 126, 136 to directly contact the second thermal layer 124. In some embodiments, the second thermal via 140 is formed behind the second interconnect wire 134, and thus, the second thermal via 140 is illustrated with dotted lines in the cross-sectional view 2700A of FIG. 27A. In some embodiments, the second thermal via 140 is formed, like the first thermal via 130, through various steps of patterning (e.g., photolithography/etching), deposition (e.g., PVD, CVD, ALD, electroplating, spin-on, electro-less plating, etc.), and removal (e.g., wet etching, dry etching, chemical mechanical planarization (CMP), etc.) processes. In some embodiments, the second thermal via 140 also comprises a same or similar material as the first thermal via 130, the first thermal layer 118, and the second thermal layer 124. Thus, in some embodiments, the second thermal via 140 comprises a material with a higher thermal conductivity than the first, second, third, and fourth interconnect dielectric layers 114, 122, 126, 136. In some embodiments, the second thermal via 140 may comprise, for example, aluminum nitride, aluminum oxide, silicon nitride, silicon carbide, magnesium oxide, beryllium oxide, boron nitride, diamond, or some other suitable insulator (i.e., not conductive) material.

Figure 27B:
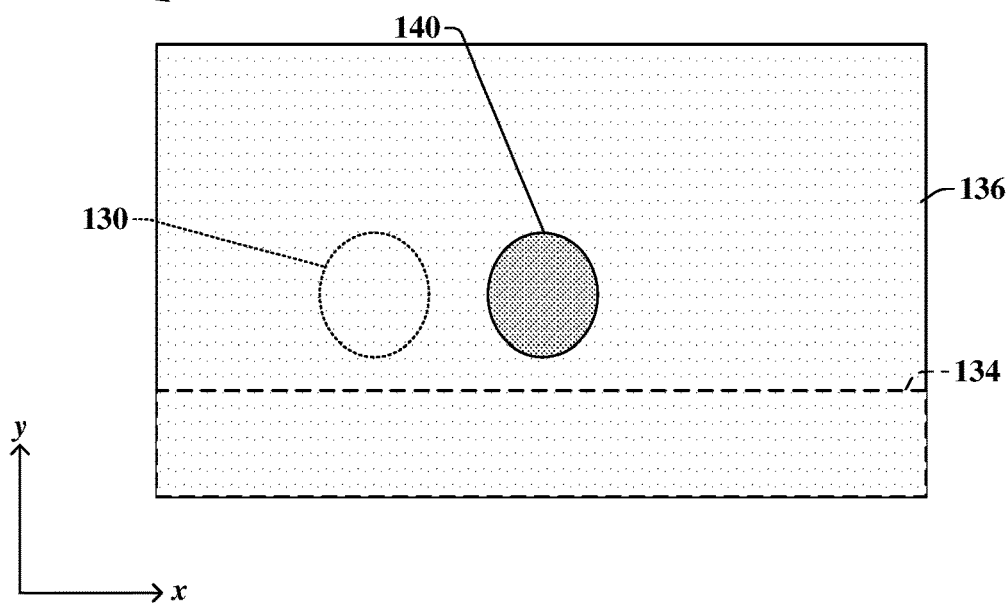

FIG. 27B illustrates some embodiments of a top-view 2700B that may correspond to the cross-sectional view 2700A of FIG. 27A. The top-views 2700B is from the perspective of the xy-plane.

As illustrated in the top-view 2700B of FIG. 27B, in some embodiments, the second thermal via 140 is spaced apart from the first interconnect wire 120 in the y-direction. In some embodiments, the second thermal via 140 is spaced apart from the first thermal via 130 in the x-direction. In some other embodiments, the second thermal via 140 may directly overlie the first thermal via 130 or may be spaced apart from the first thermal via 130 in the y-direction.

Figure 28:
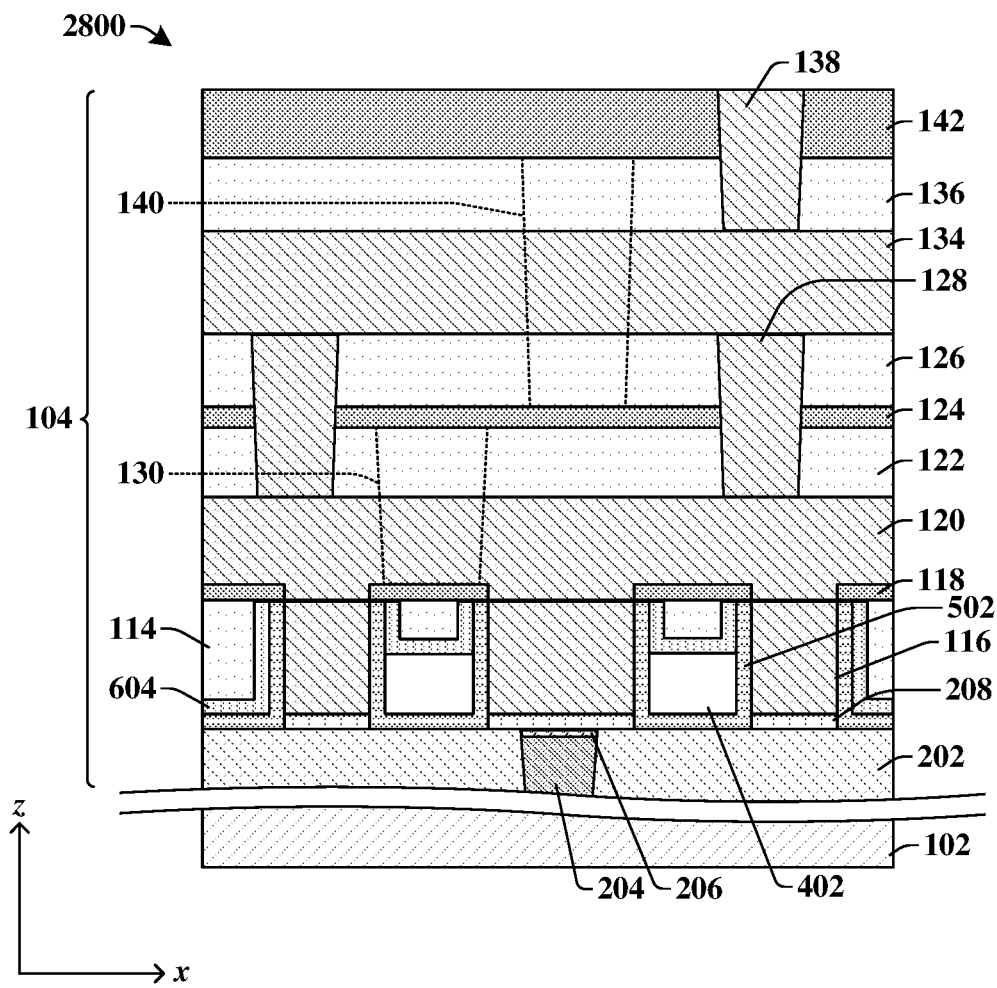

As illustrated in the cross-sectional view 2800 of FIG. 28, in some embodiments, a thermal passivation layer 142 is formed over the fourth interconnect dielectric layer 136, and a third interconnect via 138 is formed through the thermal passivation layer 142 and the fourth interconnect dielectric layer 136 to contact the second interconnect wire 134. In some embodiments, the thermal passivation layer 142 may be formed through a deposition process (e.g., PVD, CVD, ALD, electroplating, spin-on, electro-less plating, etc.) processes. In some embodiments, the thermal passivation layer 142, like the first and second thermal layers 118, 124 and the first and second thermal vias 130, 140, may comprise a material that is not conductive and that has a higher thermal conductivity than the first, second, third, and fourth interconnect dielectric layers 114, 122, 126, 136. Thus, in some embodiments, the thermal passivation layer 142 may comprise, for example, aluminum nitride, aluminum oxide, silicon nitride, silicon carbide, magnesium oxide, beryllium oxide, boron nitride, diamond, or some other suitable material.

In some embodiments, the third interconnect via 138 is formed through various steps of patterning (e.g., photolithography/etching), deposition (e.g., PVD, CVD, ALD, electroplating, spin-on, electro-less plating, etc.), and removal (e.g., wet etching, dry etching, chemical mechanical planarization (CMP), etc.) processes. In some embodiments, the third interconnect via 138 extends completely through the thermal passivation layer 142 and thus, may directly contact the thermal passivation layer 142. In some embodiments, the third interconnect via 138 may comprise a same or similar conductive material as the first interconnect vias 116, the first interconnect wire 120, the second interconnect vias 128, and the second interconnect wire 134.

In some embodiments, the third interconnect via 138 is a topmost via of an electrical interconnect structure 104 arranged over the substrate 102. In such embodiments, the electrical interconnect structure 104 comprises the interconnect vias (204, 116, 128, 138), the interconnect wires (120, 134), and the interconnect dielectric layers (202, 114, 122, 126, 136) arranged over the substrate 102. In some embodiments, the electrical interconnect structure 104 provides various electrical pathways for signals (e.g., current, voltage) to travel between various semiconductor devices arranged on or within the semiconductor substrate 102. In some embodiments, the interconnect dielectric layers (202, 114, 122, 126, 136) and any air spacer structures 402 assist in mitigating capacitance between the interconnect vias (204, 116, 128, 138) and the interconnect wires (120, 134) to increase the reliability of the electrical interconnect structure 104.

Further, in some embodiments, the thermal layers (118, 124) and the thermal vias (130, 140) make up a thermal interconnect structure that is embedded within the electrical interconnect structure 104. In some embodiments, the thermal interconnect structure may also comprise thermal wires (not shown). Nevertheless, the thermal interconnect structure has higher thermal conductivities than the interconnect dielectric layers (202, 114, 122, 126, 136) to provide thermal dissipation pathways for heat to escape from the electrical interconnect structure 104. As illustrated in the method of FIGS. 20-28, integrating the thermal interconnect structure into the electrical interconnect structure 104 does not require any complex steps; instead, the integration of the thermal interconnect structure utilizes similar processing steps (e.g., patterning, removal and deposition steps) that are used for the interconnect vias (204, 116, 128, 138) and the interconnect wires (120, 134) of the electrical interconnect structure 104. Further, in some embodiments, integrating the thermal interconnect structure into the electrical interconnect structure 104 does not require the design of the electrical interconnect structure 104 to be altered.

It will be appreciated that the methods of FIGS. 7-28 may be altered to accommodate many other designs of the electrical interconnect structure 104 and the thermal interconnect structure. Further, in some embodiments, the thermal interconnect structure of the integrated chip of FIG. 28 may be coupled to another thermal interconnect structure of another integrated chip during, for example, bonding of the integrated chip of FIG. 28 to the another thermal integrated chip to aid in heat dissipation between two stacked integrated chips.

Thus, in some embodiments, the thermal interconnect structure may be added with relatively ease into the electrical interconnect structure 104 to provide thermal dissipation pathways for generated heat to escape from the electrical interconnect structure 104 in an efficient way. By letting heat efficiently escape, the thermal interconnect structure aids in reducing thermal damage to the electrical interconnect structure and/or any semiconductor devices arranged on or within the substrate 102 to increase the longevity and reliability of the overall integrated chip.

Figure 29:
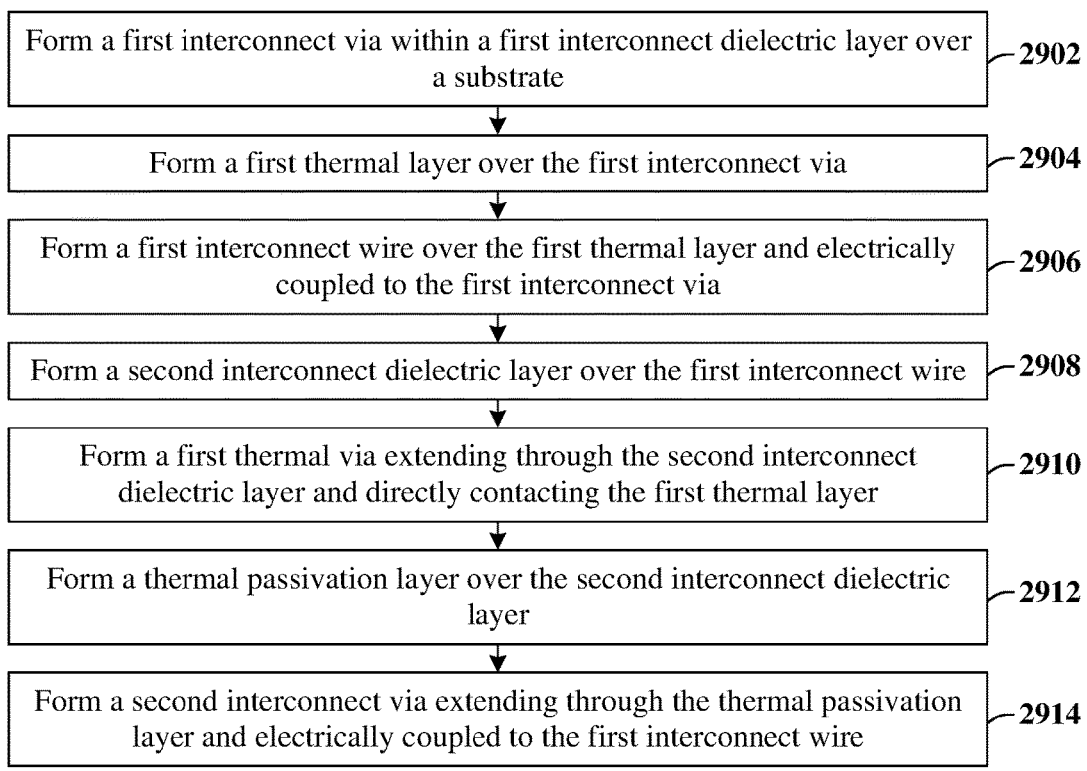
FIG. 29 illustrates a flow diagram of some embodiments of a method corresponding to the method of FIGS. 7-28.

FIG. 29 illustrates a flow diagram of some embodiments of a method 2900 corresponding to the method illustrated in FIGS. 7-28

While method 2900B is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2902, a first interconnect via is formed within a first interconnect dielectric layer over a substrate. FIG. 10 illustrates a cross-sectional view 1000 of some embodiments corresponding to act 2902.

At act 2904, a first thermal layer is formed over the first interconnect via. FIG. 20 illustrates a cross-sectional view 2000 of some embodiments corresponding to act 2904.

At act 2906, a first interconnect wire is formed over the first thermal layer and electrically coupled to the first interconnect via. FIG. 22 illustrates a cross-sectional view of some embodiments corresponding to act 2906.

At act 2908, a second interconnect dielectric layer is formed over the first interconnect wire. FIG. 23 illustrates a cross-sectional view 2600 of some embodiments corresponding to act 2908.

At act 2910, a first thermal via is formed that extends through the second interconnect dielectric layer and directly contacting the first thermal layer. FIG. 24A illustrates a cross-sectional view 2400A of some embodiments corresponding to act 2910.

At act 2912, a thermal passivation layer is formed over the second interconnect dielectric layer.

At act 2914, a second interconnect via is formed that extends through the thermal passivation layer and is electrically coupled to the first interconnect wire. FIG. 28 illustrates a cross-sectional view 2800 of some embodiments corresponding to acts 2912 and 2914.

Therefore, the present disclosure relates to a method of forming a thermal interconnect structure within an electrical interconnect structure to provide thermal dissipation pathways throughout an integrated chip to allow heat to escape from the integrated chip before causing damage to the integrated chip to increase the reliability of the integrated chip.

Accordingly, in some embodiments, the present disclosure relates to an integrated chip comprising: an electrical interconnect structure arranged over a semiconductor substrate and comprising interconnect vias and interconnect wires embedded within interconnect dielectric layers; a thermal interconnect structure arranged over the semiconductor substrate, arranged beside the electrical interconnect structure, and comprising thermal vias, thermal wires, and/or thermal layers, wherein the thermal interconnect structure is embedded within the interconnect dielectric layers; and a thermal passivation layer arranged over a topmost one of the interconnect dielectric layers, wherein the thermal interconnect structure has a higher thermal conductivity than the interconnect dielectric layers.

In other embodiments, the present disclosure relates to an integrated chip comprising: an electrical interconnect structure arranged over a semiconductor substrate and comprising interconnect vias and interconnect wires embedded within interconnect dielectric layers; a thermal passivation layer arranged over a topmost one of the interconnect dielectric layers; and a thermal dissipation pathway extending between the semiconductor substrate and the thermal passivation layer, wherein the thermal dissipation pathway comprises thermal vias, thermal wires, and/or thermal layers distributed within the interconnect dielectric layers, wherein the thermal passivation layer, the thermal vias, the thermal wires, and/or the thermal layers are continuously connected to one another and comprise materials that have a higher thermal conductivity than materials of the interconnect dielectric layers.

In yet other embodiments, the present disclosure relates to a method comprising: forming a first interconnect via within a first interconnect dielectric layer over a substrate; forming a first thermal layer over the first interconnect via; forming a first interconnect wire over the first thermal layer and electrically coupled to the first interconnect via; forming a second interconnect dielectric layer over the first interconnect wire; and forming a first thermal via extending through the second interconnect dielectric layer and directly contacting the first thermal layer, wherein the first thermal via and the first thermal layer comprise materials with higher thermal conductivities than materials of the first and second interconnect dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   an electrical interconnect structure arranged over a semiconductor substrate and comprising interconnect vias and interconnect wires embedded within interconnect dielectric layers;
   a thermal interconnect structure arranged over the semiconductor substrate, arranged beside the electrical interconnect structure, and comprising thermal vias, thermal wires, and/or thermal layers, wherein the thermal interconnect structure is embedded within the interconnect dielectric layers; and
   a thermal passivation layer arranged over a topmost one of the interconnect dielectric layers,
   wherein the thermal interconnect structure has a higher thermal conductivity than the interconnect dielectric layers, and wherein a first one of the interconnect vias extends through a first one of the thermal layers and a first one of the interconnect dielectric layers to directly contact a first one of the interconnect wires.

2. The integrated chip of claim 1, wherein the thermal passivation layer has a higher thermal conductivity than the interconnect dielectric layers.

3. The integrated chip of claim 1, wherein the thermal interconnect structure and the thermal passivation layer comprise insulator materials.

4. The integrated chip of claim 1, wherein the thermal interconnect structure directly contacts the thermal passivation layer.

5. The integrated chip of claim 1, further comprising:
   an air spacer structure arranged within the first one of the interconnect dielectric layers and directly between the first one of the interconnect vias and a second one of the interconnect vias.

6. The integrated chip of claim 1, wherein the thermal vias and/or the thermal wires are spaced apart from the interconnect vias and the interconnect wires by the interconnect dielectric layers.

7. An integrated chip comprising:
   an electrical interconnect structure arranged over a semiconductor substrate and comprising interconnect vias and interconnect wires embedded within interconnect dielectric layers;
   a thermal passivation layer arranged over a topmost one of the interconnect dielectric layers; and
   a thermal dissipation pathway extending between the semiconductor substrate and the thermal passivation layer, wherein the thermal dissipation pathway comprises thermal vias, thermal wires, and/or thermal layers distributed within the interconnect dielectric layers,
   wherein the thermal passivation layer, the thermal vias, the thermal wires, and/or the thermal layers are continuously connected to one another and comprise materials that have a higher thermal conductivity than materials of the interconnect dielectric layers, wherein a first thermal via of the thermal dissipation pathway extends from an elevation above a top surface of a first interconnect wire of the interconnect wires to an elevation at or below a bottom surface of the first interconnect wire.

8. The integrated chip of claim 7, wherein the materials of the thermal vias, the thermal wires, and/or the thermal layers have a higher thermal conductivity than materials of the interconnect vias and the interconnect wires.

9. The integrated chip of claim 7, further comprising:
   a semiconductor device arranged on the semiconductor substrate, wherein the electrical interconnect structure is directly coupled to the semiconductor device, wherein the thermal dissipation pathway is configured to provide a pathway for heat generated from the semiconductor device to travel from the semiconductor device towards the thermal passivation layer.

10. The integrated chip of claim 7, wherein a topmost interconnect via extends completely through the thermal passivation layer.

11. The integrated chip of claim 7, further comprising:
an air spacer structure embedded within the interconnect dielectric layers and directly between a first interconnect via and a second interconnect via; and
a metal encapsulation layer arranged directly on the first interconnect via and the second interconnect via, wherein the air spacer structure has outer sidewalls defined by the metal encapsulation layer.

12. The integrated chip of claim 7, further comprising:
an air spacer structure embedded within the interconnect dielectric layers and directly between a first interconnect via and a second interconnect via, wherein the air spacer structure has outermost sidewalls defined by one of the interconnect dielectric layers.

13. The integrated chip of claim 7, wherein a first thermal layer of the thermal dissipation pathway is vertically stacked with the first interconnect wire, wherein the first thermal via extends from the first thermal layer, and wherein a first interconnect via of the interconnect vias extends through the first thermal layer from the first interconnect wire.

14. The integrated chip of claim 13, further comprising:
an air spacer structure embedded within the interconnect dielectric layers and directly between the first interconnect via and a second interconnect via of the interconnect vias.

15. The integrated chip of claim 7, wherein the thermal vias and/or the thermal wires are spaced apart from the interconnect vias and the interconnect wires by the interconnect dielectric layers.

16. A method comprising:
forming a first interconnect via within a first interconnect dielectric layer over a substrate;
forming a first thermal layer over the first interconnect via;
forming a first interconnect wire over the first thermal layer and electrically coupled to the first interconnect via;
forming a second interconnect dielectric layer over the first interconnect wire; and
forming a first thermal via extending through the second interconnect dielectric layer and directly contacting the first thermal layer,
wherein the first thermal via and the first thermal layer comprise materials with higher thermal conductivities than materials of the first and second interconnect dielectric layers.

17. The method of claim 16, further comprising:
forming a thermal passivation layer over the second interconnect dielectric layer; and
forming a second interconnect via extending through the thermal passivation layer and the second interconnect dielectric layer to electrically couple to the first interconnect wire.

18. The method of claim 16, further comprising:
forming air spacer structures within the first interconnect dielectric layer, wherein the first interconnect via is between a first air spacer structure and a second air spacer structure.

19. The method of claim 18, wherein the air spacer structures are formed during the formation of the first interconnect dielectric layer.

20. The method of claim 18, wherein the air spacer structures are formed before the formation of the first interconnect dielectric layer.

* * * * *